(12) United States Patent
Jeon et al.

(10) Patent No.: US 8,664,752 B2
(45) Date of Patent: Mar. 4, 2014

(54) SEMICONDUCTOR DIE PACKAGE AND METHOD FOR MAKING THE SAME

(75) Inventors: Oseob Jeon, Seoul (KR); Yoonhwa Choi, Inchun (KR); Boon Huan Gooi, Penang (MY); Maria Cristina B. Estacio, Cebu (PH); David Chong, Penang (MY); Tan Teik Keng, Penang (MY); Shibaek Nam, Kyonggido (KR); Rajeev Joshi, Cupertino, CA (US); Chung-Lin Wu, San Jose, CA (US); Venkat Iyer, Cupertino, CA (US); Lay Yeap Lim, Penang (MY); Byoung-Ok Lee, Kyonggido (KR)

(73) Assignee: Fairchild Semiconductor Corporation, San Jose, CA (US)

( * ) Notice: Subject to any disclaimer, the term of this patent is extended or adjusted under 35 U.S.C. 154(b) by 78 days.

(21) Appl. No.: 13/430,347

(22) Filed: Mar. 26, 2012

(65) Prior Publication Data

US 2012/0181675 A1   Jul. 19, 2012

Related U.S. Application Data

(62) Division of application No. 12/823,411, filed on Jun. 25, 2010, now Pat. No. 8,183,088, which is a division of application No. 11/471,291, filed on Jun. 19, 2006, now Pat. No. 7,772,681.

(60) Provisional application No. 60/753,040, filed on Dec. 21, 2005, provisional application No. 60/701,781, filed on Jul. 22, 2005, provisional application No. 60/702,076, filed on Jul. 22, 2005, provisional application No. 60/696,320, filed on Jun. 30, 2005, provisional application No. 60/696,027, filed on Jun. 30, 2005, provisional application No. 60/696,350, filed on Jun. 30, 2005, provisional application No. 60/696,305, filed on Jun. 30, 2005.

(51) Int. Cl.
*H01L 23/495*   (2006.01)

(52) U.S. Cl.
USPC ........... 257/666; 257/667; 257/668; 257/669; 257/670; 257/701; 257/702; 257/703; 257/704; 257/705; 257/E23.037; 257/E33.606; 257/E21.499; 438/106; 438/107; 438/110; 438/111; 438/112; 438/123; 438/124; 438/125; 438/126; 438/127

(58) Field of Classification Search
None
See application file for complete search history.

(56) References Cited

U.S. PATENT DOCUMENTS

| | | |
|---|---|---|
| 4,680,613 A | 7/1987 | Daniels |
| 4,720,396 A | 1/1988 | Wood |

(Continued)

FOREIGN PATENT DOCUMENTS

| | | |
|---|---|---|
| JP | 8250641 A | 9/1996 |
| JP | 2003046054 A | 2/2003 |
| JP | 2003282809 A | 10/2003 |

OTHER PUBLICATIONS

Office Action (including English translation) dated Jan. 14, 2010, from Austrian Patent Application No. A 9261/2006; 7 pages.

(Continued)

*Primary Examiner* — Yasser Abdelaziez
(74) *Attorney, Agent, or Firm* — Christensen O'Connor Johnson Kindness PLLC

(57) ABSTRACT

Semiconductor die packages are disclosed. An exemplary semiconductor die package includes a premolded substrate. The premolded substrate can have a semiconductor die attached to it, and an encapsulating material may be disposed over the semiconductor die.

10 Claims, 33 Drawing Sheets

(56) References Cited

U.S. PATENT DOCUMENTS

| | | |
|---|---|---|
| 4,731,701 A | 3/1988 | Kuo et al. |
| 4,751,199 A | 6/1988 | Phy |
| 4,769,709 A | 9/1988 | Van De Steeg |
| 4,772,935 A | 9/1988 | Lawler et al. |
| 4,791,473 A | 12/1988 | Phy |
| 4,890,153 A | 12/1989 | Wu |
| 5,172,214 A | 12/1992 | Casto |
| 5,450,283 A | 9/1995 | Lin et al. |
| 5,537,075 A | 7/1996 | Miyazaki |
| 5,637,916 A | 6/1997 | Joshi |
| 5,729,437 A | 3/1998 | Hashimoto |
| 5,765,280 A | 6/1998 | Joshi |
| 5,777,386 A | 7/1998 | Higashi et al. |
| 5,789,809 A | 8/1998 | Joshi |
| 6,034,441 A | 3/2000 | Chen |
| 6,133,634 A | 10/2000 | Joshi |
| 6,143,981 A | 11/2000 | Glenn |
| 6,229,200 B1 | 5/2001 | Mclellan et al. |
| 6,242,281 B1 | 6/2001 | Mclellan et al. |
| 6,294,403 B1 | 9/2001 | Joshi |
| 6,307,272 B1 | 10/2001 | Takahashi et al. |
| 6,384,472 B1 | 5/2002 | Huang |
| 6,388,319 B1 | 5/2002 | Cheah et al. |
| 6,404,044 B2 | 6/2002 | Akram et al. |
| 6,424,035 B1 | 7/2002 | Sapp et al. |
| 6,433,277 B1 | 8/2002 | Glenn |
| 6,437,429 B1 | 8/2002 | Su et al. |
| 6,449,174 B1 | 9/2002 | Elbanhawy |
| 6,469,384 B2 | 10/2002 | Joshi |
| 6,479,888 B1 | 11/2002 | Hirashima et al. |
| 6,489,678 B1 | 12/2002 | Joshi |
| 6,498,099 B1 | 12/2002 | McLellan et al. |
| 6,518,653 B1 | 2/2003 | Takagi |
| 6,528,869 B1 | 3/2003 | Glenn et al. |
| 6,545,364 B2 | 4/2003 | Sakamoto et al. |
| 6,556,750 B2 | 4/2003 | Constantino et al. |
| 6,566,749 B1 | 5/2003 | Joshi et al. |
| 6,624,507 B1 | 9/2003 | Nguyen et al. |
| 6,627,991 B1 | 9/2003 | Joshi |
| 6,633,030 B2 | 10/2003 | Joshi |
| 6,642,738 B2 | 11/2003 | Elbanhawy |
| 6,645,791 B2 | 11/2003 | Noquil et al. |
| 6,661,082 B1 | 12/2003 | Granada et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,753,605 B2 | 6/2004 | Joshi |
| 6,777,800 B2 | 8/2004 | Madrid et al. |
| 6,780,679 B2 | 8/2004 | Ito et al. |
| 6,784,376 B1 | 8/2004 | Huemoeller et al. |
| 6,798,044 B2 | 9/2004 | Joshi |
| 6,798,047 B1 | 9/2004 | Miks et al. |
| 6,806,580 B2 | 10/2004 | Joshi et al. |
| 6,818,973 B1 | 11/2004 | Foster |
| 6,830,959 B2 | 12/2004 | Estacio |
| 6,836,023 B2 | 12/2004 | Joshi et al. |
| 6,858,467 B2 | 2/2005 | Moden |
| 6,867,481 B2 | 3/2005 | Joshi et al. |
| 6,867,489 B1 | 3/2005 | Estacio |
| 6,876,068 B1 | 4/2005 | Lee et al. |
| 6,891,256 B2 | 5/2005 | Joshi et al. |
| 6,891,257 B2 | 5/2005 | Chong et al. |
| 6,893,901 B2 | 5/2005 | Madrid |
| 6,899,534 B2 * | 5/2005 | Tandy ............... 425/117 |
| 6,911,718 B1 | 6/2005 | Alegre et al. |
| 6,943,434 B2 | 9/2005 | Tangpuz et al. |
| 6,949,410 B2 | 9/2005 | Joshi et al. |
| 6,953,998 B2 | 10/2005 | Joshi |
| 6,989,588 B2 | 1/2006 | Quinones et al. |
| 6,992,384 B2 | 1/2006 | Joshi |
| 7,008,868 B2 | 3/2006 | Joshi |
| 7,022,548 B2 | 4/2006 | Joshi et al. |
| 7,023,077 B2 | 4/2006 | Madrid |
| 7,029,947 B2 | 4/2006 | Joshi |
| 7,061,077 B2 | 6/2006 | Joshi |
| 7,081,666 B2 | 7/2006 | Joshi et al. |
| 7,101,734 B2 | 9/2006 | Granada et al. |
| 7,439,613 B2 | 10/2008 | Joshi et al. |
| 7,504,281 B2 | 3/2009 | Joshi |
| 7,772,681 B2 | 8/2010 | Joshi et al. |
| 2001/0015488 A1 | 8/2001 | Akram et al. |
| 2001/0045625 A1 | 11/2001 | Sakamoto et al. |
| 2002/0066950 A1 | 6/2002 | Joshi |
| 2002/0066959 A1 | 6/2002 | Joshi |
| 2002/0084511 A1 | 7/2002 | Konishi |
| 2002/0093026 A1 | 7/2002 | Huang |
| 2002/0093094 A1 | 7/2002 | Takagawa et al. |
| 2002/0100962 A1 | 8/2002 | Joshi |
| 2002/0163070 A1 | 11/2002 | Choi |
| 2002/0167075 A1 | 11/2002 | Madrid |
| 2003/0059174 A1 | 3/2003 | Yoshikawa |
| 2003/0075786 A1 | 4/2003 | Joshi et al. |
| 2003/0089981 A1 | 5/2003 | Modem |
| 2003/0146508 A1 | 8/2003 | Chen et al. |
| 2003/0164554 A1 | 9/2003 | Fee et al. |
| 2004/0041242 A1 | 3/2004 | Joshi |
| 2004/0125573 A1 | 7/2004 | Joshi et al. |
| 2004/0173894 A1 | 9/2004 | Glenn et al. |
| 2004/0212073 A1 | 10/2004 | Divakar et al. |
| 2005/0003586 A1 | 1/2005 | Shimanuki et al. |

OTHER PUBLICATIONS

Search/Examination Report dated Mar. 4, 2011 from Japanese Patent Application No. 2008-519374, 4 pages.

Office Action (including English translation) dated Mar. 23, 2011 from Chinese Patent Application No. 201010147483.X; 25 pages.

\* cited by examiner

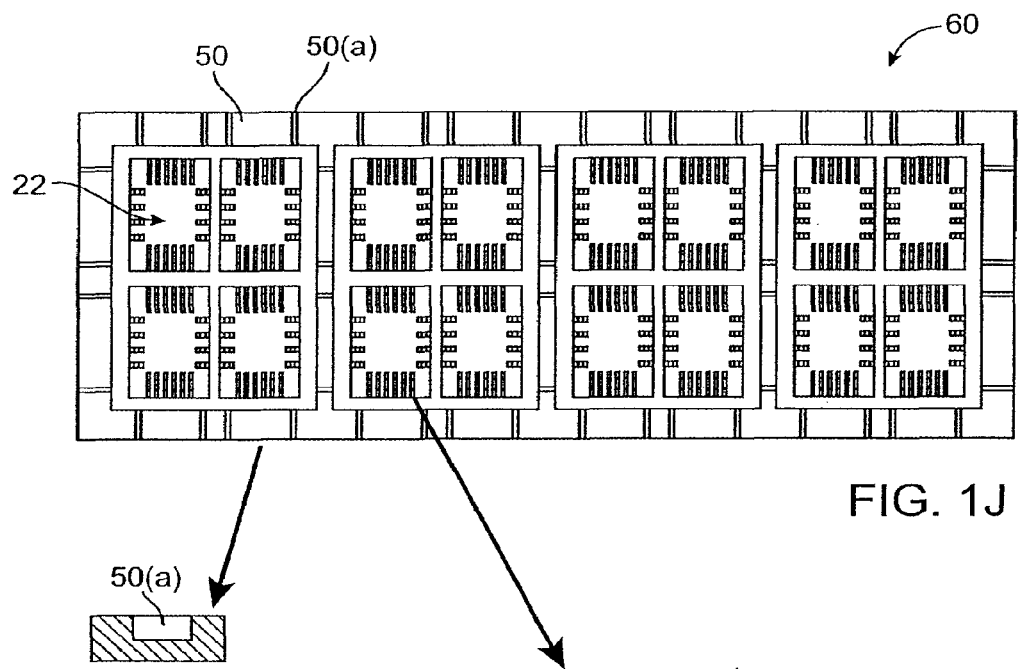
FIG. 1J
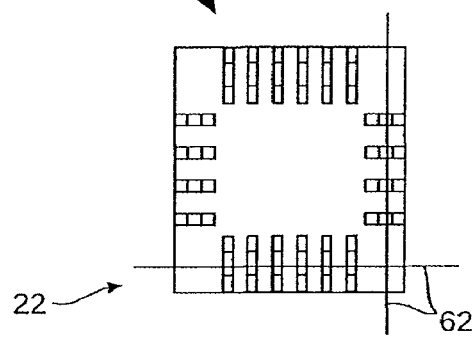
FIG. 1K
FIG. 1L

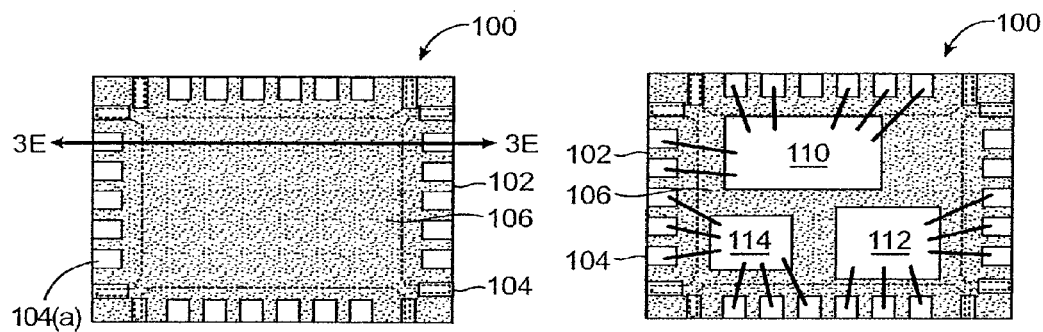
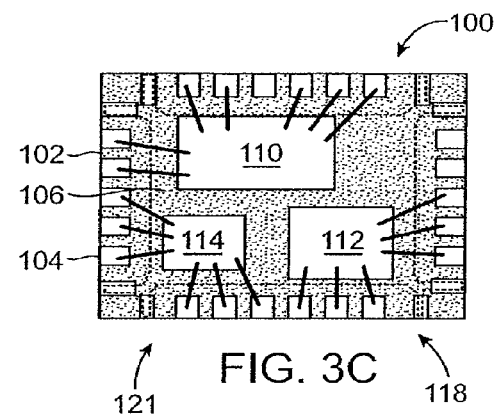
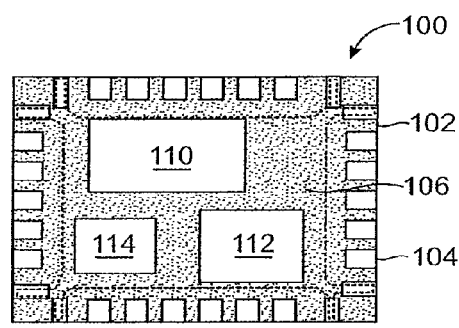
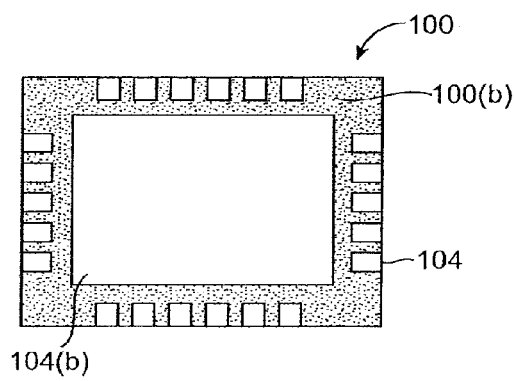
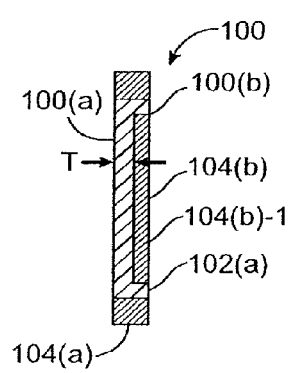
FIG. 3A
FIG. 3C
FIG. 3B
FIG. 3D
FIG. 3E

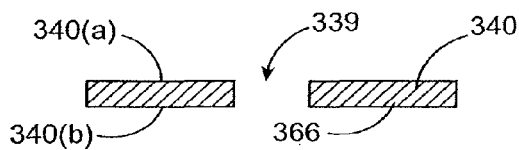
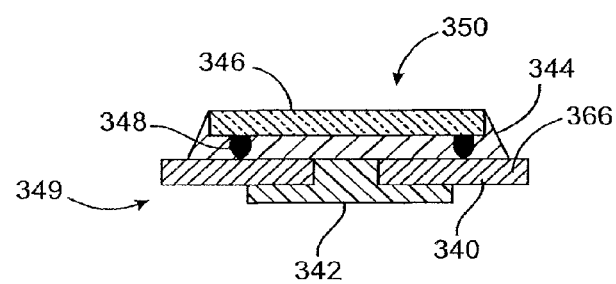
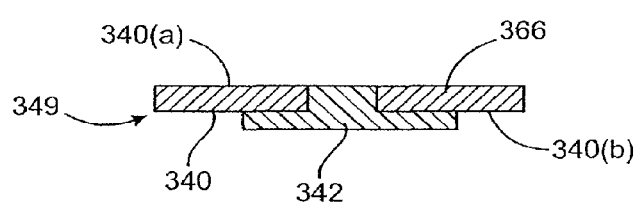
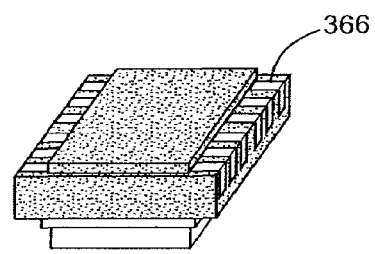
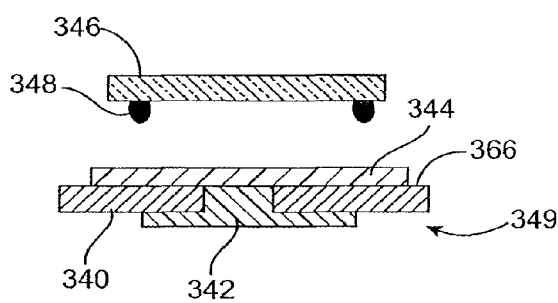
FIG. 14A
FIG. 14D
FIG. 14B
FIG. 14E
FIG. 14C

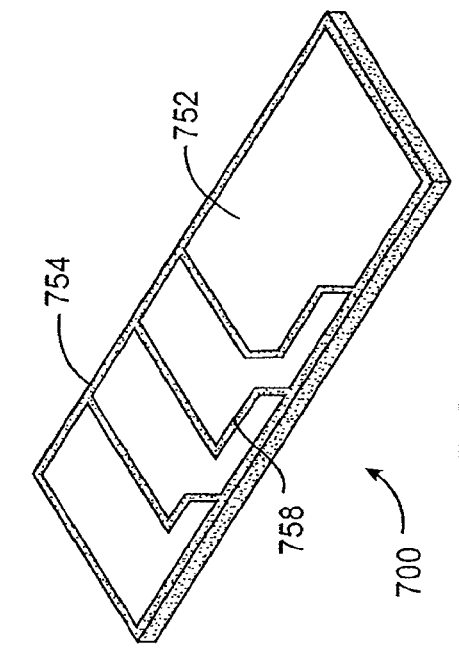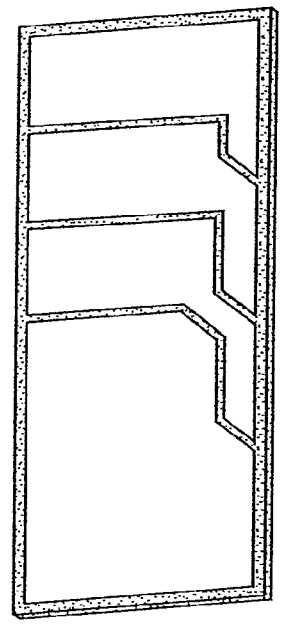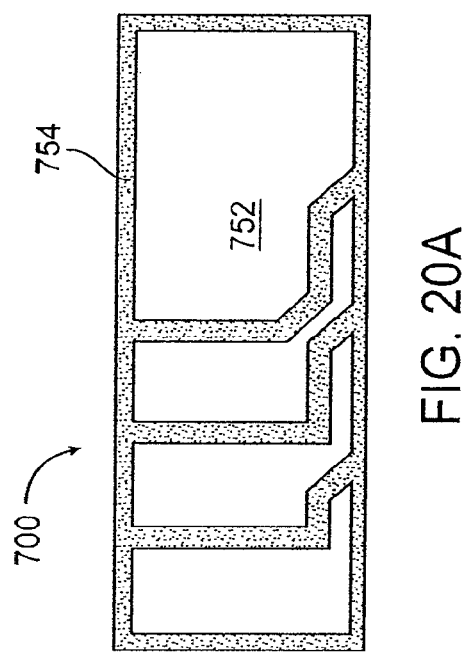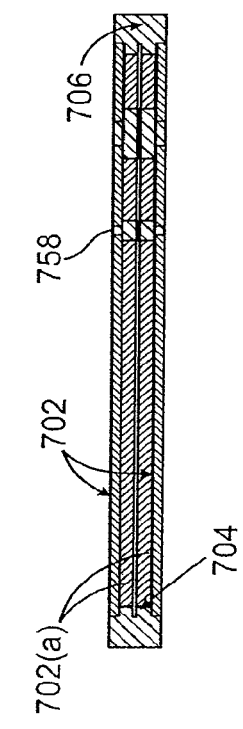
FIG. 20B
FIG. 20D
FIG. 20A
FIG. 20C

SEMICONDUCTOR DIE PACKAGE AND METHOD FOR MAKING THE SAME

CROSS-REFERENCES TO RELATED APPLICATIONS

This patent application is a divisional of U.S. patent application Ser. No. 12/823,411, filed Jun. 25, 2010, now allowed, which is a divisional of U.S. patent application Ser. No. 11/471,291, filed Jun. 19, 2006, (now U.S. Pat. No. 7,772,681), which is a non-provisional of and claims the benefit of the following U.S. Provisional Applications: 60/701,781, filed on Jul. 22, 2005; 60/696,320, filed on Jun. 30, 2005; 60/696,027, filed on Jun. 30, 2005; 60/696,350, filed on Jun. 30, 2005; 60/702,076, filed on Jul. 22, 2005; 60/696,305, filed on Jun. 30, 2005, and 60/753,040, filed on Dec. 21, 2005, the disclosures of which are herein incorporated by reference in their entirety for all purposes.

BACKGROUND OF THE INVENTION

Various semiconductor die packages are known.

While such packages are useful, they could be improved. For example, many of the above-described packages are difficult and/or expensive to make.

Accordingly, it would be desirable to provide for improved semiconductor die packages, methods for making semiconductor die packages, components of such die packages, and electrical assemblies using such semiconductor die packages. Such improved semiconductor die packages would desirably be less costly to manufacture and/or would have better functionality.

SUMMARY OF THE INVENTION

Embodiments of the invention are directed to semiconductor die packages, methods for making semiconductor die packages, and electrical assemblies including the semiconductor die packages.

One embodiment of the invention is directed to a method comprising: obtaining a premolded substrate including a leadframe structure and a molding material, wherein the leadframe structure includes a first conductive portion, a second conductive portion, and an intermediate portion between the first conductive portion and the second conductive portion; cutting the intermediate portion to electrically isolate the first conductive portion from the second conductive portion; attaching a semiconductor die to the substrate; and electrically coupling the first and second conductive portions to the semiconductor die.

Another embodiment of the invention is directed to a semiconductor die package comprising: a premolded substrate including a leadframe structure and a molding material, wherein the leadframe structure includes a first conductive portion, a second conductive portion, and a cavity between the first conductive portion and the second conductive portion; a semiconductor die on the premolded substrate; and an encapsulating material covering the semiconductor die and filling the cavity between the first conductive portion and the second conductive portion.

Another embodiment of the invention is directed to a method comprising: obtaining a premolded substrate including a first surface and a second surface, wherein the premolded substrate includes a leadframe structure and a molding material, wherein the leadframe structure comprises a pad region, wherein an exterior surface of the pad region and an exterior surface of the molding material are substantially coplanar and coincide with the second surface of the premolded substrate; and attaching at least two semiconductor dice to the first surface of premolded substrate.

Another embodiment of the invention is directed to a semiconductor die package comprising: a premolded substrate including a first surface and a second surface, wherein the premolded substrate includes a leadframe structure and a molding material, wherein the leadframe structure comprises a pad region, wherein an exterior surface of the pad region and an exterior surface of the molding material are substantially coplanar and coincide with the second surface of the premolded substrate; and at least two semiconductor dice coupled to the first surface of premolded substrate.

Another embodiment of the invention is directed to a method for forming a forming a semiconductor die package, the method comprising: forming a substrate, wherein forming a substrate comprises (i) placing a leadframe structure between at least a first molding die and a second molding die, (ii) contacting the leadframe structure with the first and second molding dies, and (iii) forming a molding material around the leadframe structure; attaching a semiconductor die to the substrate; and encapsulating the semiconductor die in an encapsulating material.

Another embodiment of the invention is directed to a semiconductor die package comprising: a substrate, wherein forming a substrate comprises a leadframe structure and a molding material, wherein the substrate forms at least one concave structure; and a semiconductor die on the substrate.

Another embodiment of the invention is directed to a method comprising: obtaining a substrate including a leadframe structure and a molding material, wherein a surface of the molding material and the leadframe structure are substantially coplanar, and wherein the substrate includes a first die attach region and a second die attach region; attaching a first semiconductor die to the first die attach region; and attaching a second semiconductor die to the second die attach region.

Another embodiment of the invention is directed to a semiconductor die package comprising: a substrate including a leadframe structure and a molding material, wherein a surface of the molding material and the leadframe structure are substantially coplanar, and wherein the substrate includes a first die attach region and a second die attach region; a first semiconductor die on the first die attach region; and a second semiconductor die on the second die attach region.

Another embodiment of the invention is directed to a method for making a substrate for a semiconductor die package, the method comprising: obtaining a first leadframe structure and a second leadframe structure; attaching the first and second leadframe structure together using an adhesion layer; and applying a molding material to the first leadframe structure, the second leadframe structure, or the adhesion layer.

Another embodiment of the invention is directed to a semiconductor die package comprising: a premolded substrate comprising a leadframe structure and a molding material, wherein an exterior surface of the leadframe structure and an exterior surface of the molding material are substantially coplanar; and a semiconductor die on the premolded substrate; leads attached to the premolded substrate, wherein the leads were separately formed from the premolded substrate.

Another embodiment of the invention is directed to a method comprising: obtaining a substrate comprising a conductive die attach surface; attaching a high side transistor including a high side transistor input to the substrate, wherein the high side transistor input is coupled to the conductive die attach surface; and attaching a low side transistor including a low side transistor output to the substrate, wherein the low side transistor input is coupled to the conductive die attach surface.

Another embodiment of the invention is directed to a semiconductor device package comprising: a substrate comprising a conductive die attach surface; a high side transistor including a high side transistor input, wherein the high side transistor input is coupled to the conductive die attach surface; and a low side transistor including a low side transistor output, wherein the low side transistor input is coupled to the conductive die attach surface.

These and other embodiments of the invention are described in further detail below.

BRIEF DESCRIPTION OF THE DRAWINGS

FIG. 1J is a top plan view of an assembly of substrates during manufacture.

FIG. 1K is a side, cross-sectional view of a rail including a reference groove.

FIG. 1L shows a top plan view of a substrate with cutting lines.

FIGS. 3A-3C show a top plan view of a semiconductor die package as it is being assembled.

FIG. 3D shows a bottom plan view of a semiconductor die package.

FIG. 3E shows a side cross-sectional view of a substrate according to an embodiment of the invention.

FIG. 14A-14D show cross-sectional views of another semiconductor die package has it is being formed.

FIG. 14E shows a perspective view of the semiconductor die package shown in FIG. 14D.

FIG. 18A-2 is a top perspective view of a leadframe structure that has been partially etched.

FIG. 18B-1 is a bottom perspective view of a premolded substrate.

FIG. 18B-2 is a top perspective view of a premolded substrate.

FIG. 20A is a top plan view of a premolded substrate according to an embodiment of the invention.

FIG. 20B shows a top perspective view of a premolded substrate according to an embodiment of the invention.

FIG. 20C shows a side, cross-sectional view of a premolded substrate according to an embodiment of the invention.

FIG. 20D is a bottom perspective view of a premolded substrate according to an embodiment of the invention.

DETAILED DESCRIPTION

Figure 1A:
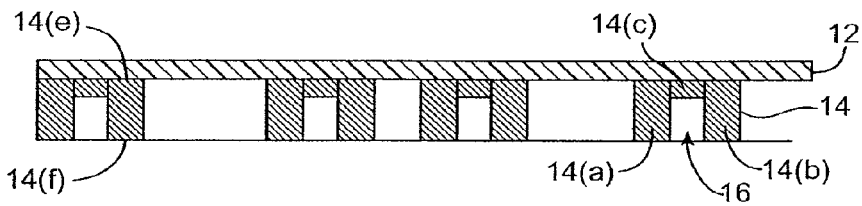
FIGS. 1A-1H show cross-sectional views of components during the formation of a semiconductor die package according to an embodiment of the invention.

Embodiments of the invention are directed to semiconductor die packages and methods for making semiconductor die packages. A semiconductor die package according to an embodiment of the invention includes a substrate, and a semiconductor die mounted on the substrate. The semiconductor die may at attached to the substrate using an adhesive or any other suitable attachment material. In the semiconductor die package, the bottom surface and/or the top surface of the semiconductor die may be electrically coupled to conductive regions of the substrate. An encapsulating material may encapsulate the semiconductor die. As will be explained in further detail below, the substrates according to embodiments of the invention can have different configurations in different embodiments.

The substrate may have any suitable configuration. However, in preferred embodiments of the invention, the substrate includes a leadframe structure and a molding material. Typically, at least one surface of the leadframe structure is substantially coplanar with an exterior surface of the molding material. In some embodiments, both opposing major surfaces of the leadframe structure are substantially coplanar with opposing exterior surfaces of the molding material in the substrate. In other embodiments, only one major surface of the leadframe structure is substantially coplanar with an exterior surface of the molding material.

The term "leadframe structure" can refer to a structure that is derived from a leadframe. Leadframe structures can be formed by, for example, stamping processes which are known in the art. An exemplary leadframe structure can also be formed by etching a continuous conductive sheet to form a predetermined pattern. Thus, in embodiments of the invention, a leadframe structure in a semiconductor die package may be a continuous metallic structure or a discontinuous metallic structure.

A leadframe structure according to an embodiment of the invention may originally be one of many leadframe structures in an array of leadframe structures that are connected together by tie-bars. During the process of making a semiconductor die package, the leadframe structure array may be cut to separate individual leadframe structures from each other. As a result of this cutting, portions of a leadframe structure (such as a source lead and a gate lead) in a final semiconductor die package may be electrically and mechanically uncoupled from each other. In other embodiments, an array of leadframe structures is not used when manufacturing semiconductor die packages according to embodiments of the invention.

A leadframe structure according to an embodiment of the invention many comprise any suitable material, may have any suitable form, and may have any suitable thickness. Exemplary leadframe structure materials include metals such as copper, aluminum, gold, etc., and alloys thereof. The leadframe structures may also include plated layers such as plated layers of gold, chromium, silver, palladium, nickel, etc.

A leadframe structure according to an embodiment of the invention may also have any suitable configuration. For example, the leadframe structure may also have any suitable thickness including a thickness less than about 1 mm (e.g., less than about 0.5 mm). In addition, the leadframe structure may have a die attach region which may form a die attach pad (DAP). Leads may extend laterally away from the die attach region. They may also have surfaces that are and/or are not coplanar with the surface forming the die attach region. For example, in some examples, the leads may be bent downwardly with respect to the die attach region.

If the leads of the leadframe structure do not extend laterally outward past the molding material, the substrate can be considered a "leadless" substrate and a package including the substrate could be considered a "leadless" package. If the leads of the leadframe structure extend past the molding material, then the substrate can be a "leaded" substrate and the package may be a "leaded package".

The molding material that is used in the substrate may comprise any suitable material. Suitable molding materials include biphenyl based materials, and multi-functional cross-linked epoxy resin composite materials. Suitable molding materials are deposited in liquid or semi-solid form on a leadframe structure, and are thereafter cured to harden them.

The semiconductor die that is mounted on the substrate may include any suitable semiconductor device. Suitable devices may include vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die. Exemplary semiconductor devices are also described in U.S. patent application Ser. No. 11/026,276, filed on Dec. 29, 2004, which is herein incorporated by reference in its entirety for all purposes.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

An encapsulating material may be used to encapsulate the semiconductor die. The encapsulating material may comprise the same or different type of material as the previously described molding material. In some embodiments, the encapsulating material covers or at least partially covers the substrate, and one or more semiconductor dice on the substrate. The encapsulating material may be used to protect the one or more semiconductor dice from potential damage due to exposure to the surrounding environment.

Any suitable process may be used to encapsulate the semiconductor die(s) and/or the substrate that supports the semiconductor dice(s). For example, a semiconductor die and substrate may be placed in a molding die, and an encapsulating material may be formed around at least part of the semiconductor die and/or the substrate. Specific molding conditions are known to those of ordinary skill in the art.

I. Die Packages Including Substrates Having Cut Isolation Regions

As the feature sizes of microlead package (MLP) components get smaller and smaller, designs are constrained by metal-to-metal clearance and dimensional tolerance capabilities of etched and half-etched frame technology. Embodiments of the invention disclose a premolded frame layout that is able to accommodate dual rows for exposed pads. A dual row MLP has a smaller package size as compared to a single row MLP for the same number of leads. In embodiments of the invention, a leadframe structure is premolded and is then sawed to isolate two conductive pads.

An embodiment of the invention is directed to a method including obtaining a premolded substrate including a leadframe structure and a molding material, where the leadframe structure includes a first conductive portion, a second conductive portion, and an intermediate portion between the first conductive portion and the second conductive portion. The molding material in the substrate may have a thickness that is substantially equal to a thickness of the leadframe structure. For example, the thickness of the molding material may be substantially equal to the thickness of the first conductive portion and/or the second conductive portion.

The intermediate portion is then cut to electrically isolate the first conductive portion from the second conductive portion. The first and second conductive portions may form different terminals in a die package. For example, the first and second conductive portions may be selected from the group consisting of a gate lead, a source lead, and a drain lead, where the first and second conductive portions are different. Multiple sets of first and second conductive portions may form rows of conductive regions.

After cutting the leadframe structure, at least one semiconductor die is attached to the substrate. A suitable adhesive or solder can be used to attach the semiconductor die to the substrate. The semiconductor die may be of the type described above. For example, the leadframe structure may be a semiconductor die comprising a power MOSFET.

After the semiconductor die is attached to the substrate, the semiconductor die may be electrically coupled to the first and second conductive portions. For example, the semiconductor die and the first and second conductive portions may be wirebonded together. Alternatively, conductive clips can be used to electrically couple the semiconductor die to the first and second conductive portions.

After the semiconductor die is electrically coupled to the first and second portions in the premolded substrate, an encapsulating material may be deposited over the semiconductor die to encapsulate it. The encapsulating material may be the same or different type of material as the above-described molding material.

The formed semiconductor die package may have leads that do not extend past an exterior surface of the molding material. In some embodiments, the formed semiconductor die package may be referred to as a "microlead package" or MLP package.

Exemplary methods and die packages can be described with respect to FIGS. 1A-1L.

FIG. 1A shows a leadframe structure 14 according to an embodiment of the invention. The leadframe structure 14 in this example is free of a die attach pad (DAP). As will be explained below, the substrate which includes the leadframe structure 14 will have a die attach region formed from a molding material. The leadframe structure 14 has a first surface 14(e) that is opposite to a second surface 14(f) of the leadframe structure 14.

The leadframe structure 14 includes a first conductive portion 14(a), a second conductive portion 14(b), and an intermediate portion 14(c) between the first conductive portion 14(a) and the second conductive portion 14(b). As shown, the thicknesses of the first and second conductive portions 14(a), 14(b) are about the same, but the thickness of the intermediate portion 14(c) is less than the thicknesses of the first and second conductive portions 14(a), 14(b). As a result of these different thicknesses, a gap 16 is defined by the first conductive portion 14(a), the second conductive portion 14(b), and the intermediate portion 14(c).

The leadframe structure 14 may be formed using any suitable process. For example, the leadframe structure 14 may be formed using photoresist and etching processes, or stamping processes. These processes and other processes are well known to those of ordinary skill in the art. For instance, the gap 16 shown in FIG. 1A may be formed using well known photolithography and etching processes. In exemplary photolithography and etching process, a bare metal structure (not shown) can be coated with a layer of photoresist. This layer of photoresist can be imaged and developed. Exposed regions of the metal structure may be etched using a wet or dry etching process. The cavity 16 can be formed using a wet or dry etching process.

As shown in FIG. 1A, after the leadframe structure 14 is formed, a piece of tape 12 may be attached to the first surface 14(e) of the leadframe structure 14. The piece of tape 12 covers the first surface 14(e) of the leadframe structure 14 so that the molding material that is used to form the substrate does not cover the first surface 14(e).

Figure 1B:
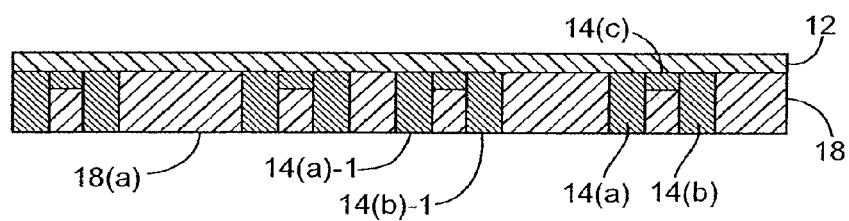

As shown in FIG. 1B, after attaching the tape 12 to the first surface 14(e) of the leadframe structure 14, a molding material 18, such as an epoxy molding material, can be deposited and solidified on the leadframe structure 14. The molding material 18 fills the gap 16 of the leadframe structure 14 and the interstices between the various first and second conductive portions 14(a), 14(b). Excess molding material may be removed so that the second surface 14(f) is not covered with molding material. However, the region between the first and second surfaces 14(e), 14(f) of the leadframe structure 14 is filled with the molding material 18 in this example.

As shown in FIG. 1B, an exterior surface 18(a) of the molding material 18 may be substantially coplanar with exterior surfaces 14(a)-1, 14(b)-1 of the first and second conductive portions 14(a), 14(b). As shown, the thickness of the molding material 18, at certain locations, is substantially equal to the thickness of the first and second conductive portions 14(a), 14(b).

Figure 1C:
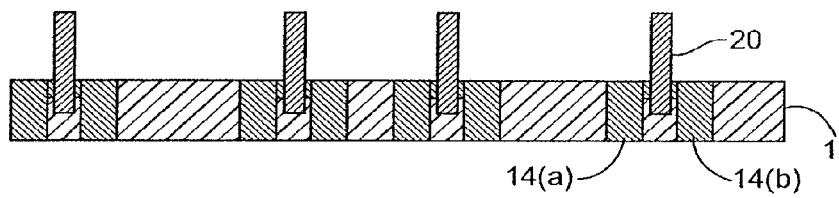

As shown in FIG. 1C, after molding, a first cutting element 20 cuts the intermediate portion 14(c) of the leadframe structure 14 to thereby form one or more cavities 24 in the substrate 22. The one or more cavities 24 may extend entirely through the intermediate portion 14(c) and may partially extend into the molding material 18. The cavities 24 may be formed through half the thickness (or less) of the thickness of the substrate 22. By cutting the intermediate portion 14(c), the first and second conductive portions 14(a), 14(b) can be electrically and mechanically isolated from each other. As will be explained in detail below, the isolated first and second conductive portions 14(a), 14(b) may thereafter serve as separate electrical terminals (e.g., electrical bonding pads) in the resulting semiconductor die package.

Any suitable first cutting element 20 may be used to cut the intermediate portion 14(c). For example, the first cutting element 20 may be a water jet, a saw, etching material, or a laser.

Figure 1D:
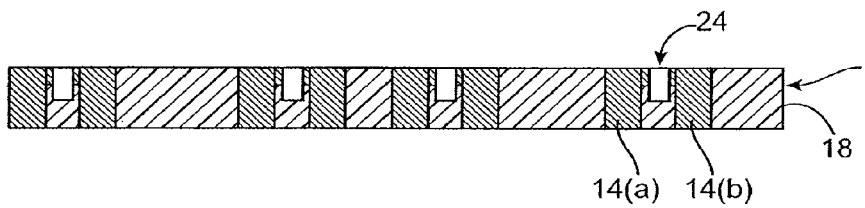

As shown in FIG. 1D, after cutting, a premolded substrate 22 is formed. The substrate 22 has cavities 24 where cutting was performed. The cavities 24 uncouple the first and second conductive regions 14(a), 14(b) so that they are mechanically and electrically isolated from each other.

The formed premolded substrate 22 may or may not have leads that extend past the lateral edges of the molding material 18. In the specific substrate 22, the leads of the leadframe structure 14 correspond with the first and second conductive regions 14(a), 14(b). In other embodiments, the substrate 22 may have leads which extend laterally outside of the lateral edges of the leadframe structure 14 and may or may not be bent downwardly to form terminal connections.

Figure 1E:
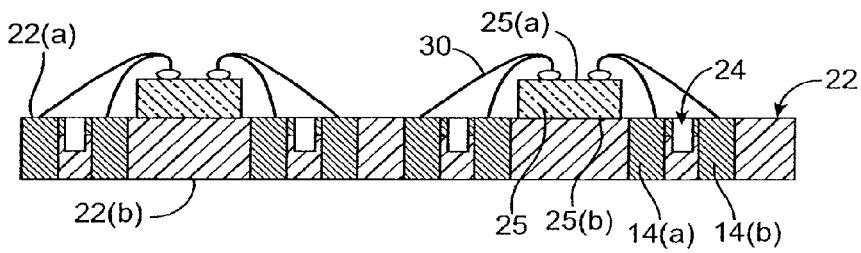

As shown in FIG. 1E, one or more semiconductor dice 25 may then be mounted on the substrate 22. The substrate 22 may include a first surface 22(a) and a second surface 22(b) opposite to the first surface 22(a). In this example, there are at least two semiconductor dice 25 mounted directly on the molding material 18. Multiple semiconductor dice 25 may be mounted on the substrate 22 if multiple semiconductor die packages are to be formed. As explained below, joined packages can be formed and these can be eventually separated from each other in a singulation process.

Any suitable material may be used to mount the one or more semiconductor dice 25 to the substrate 22. For example, solder, or a conductive or non-conductive adhesive, may be used to mount the one or more semiconductor dice 25 on the substrate 22. Suitable adhesives include filled or unfilled epoxy adhesives.

The one or more semiconductor dice 25 may be mounted at any suitable location on the substrate 22. As shown in FIG. 1E, the one or more semiconductor dice 25 are mounted to an insulating material such as the molding material 18. In other embodiments, the leadframe structure 14 may include one or more conductive die attach pads (not shown) and the one or more semiconductor dice 25 may be mounted to the one or more die attach pads.

The semiconductor dice 25 may be any of the above described semiconductor dice. For example, each die 25 may have a first surface 25(a) and a second surface 25(b), where the second surface 25(b) is closer to the substrate 22 than the first surface 25(a). In some embodiments, the first surface 25(a) may have a source terminal, a gate terminal, and a drain terminal, while the second surface 25(b) does not have any terminals. In other embodiments, the first surface 25(a) may have a source and/or gate terminal, while the second surface 25(b) has a drain terminal (or vice-versa). In this case, the one or more semiconductor dice 25 can be mounted on conductive die attach pads (not shown) instead of the molding material 18.

After mounting the one or more semiconductor dice 25, wires 30 may be attached to (and therefore electrically couple) electrical terminals at the first surface 25(a) of the semiconductor dice 25 and the first and second conductive portions 14(a), 14(b). The wires 30 may alternatively referred to as "wirebonds". The wires may be formed of a noble metal such as gold, silver, platinum, etc., or may include a transition metal such as copper, aluminum, etc. In some embodiments, the wires may be in the form of coated wires (e.g., a copper wire coated with a noble metal such as gold or platinum). Alternatively or additionally, conductive clips may be used to electrically couple the electrical terminals at the first surface 25(a) of the semiconductor die 25 to the first and second conductive portions 14(a), 14(b).

Figure 1F:
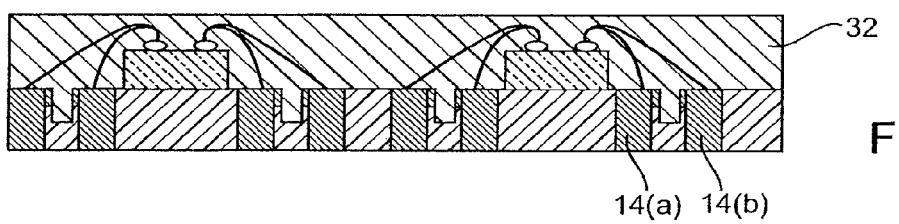

Referring to FIG. 1F, an encapsulating material 32 may then be deposited on the first surface 22(a) of the substrate 22 and on the semiconductor dice 25 mounted on the first surface 22(a) of the substrate 22. The encapsulating material 32 fills the previously formed gaps 24 in the substrate 22. The filling of the cavities 24 in the substrate 22 by the encapsulating material 32 advantageously "locks" the encapsulating material 32 to the substrate 22. The encapsulating material 32 can also be molded so that it does not extend past the side edges of the substrate 22.

Figure 1G:
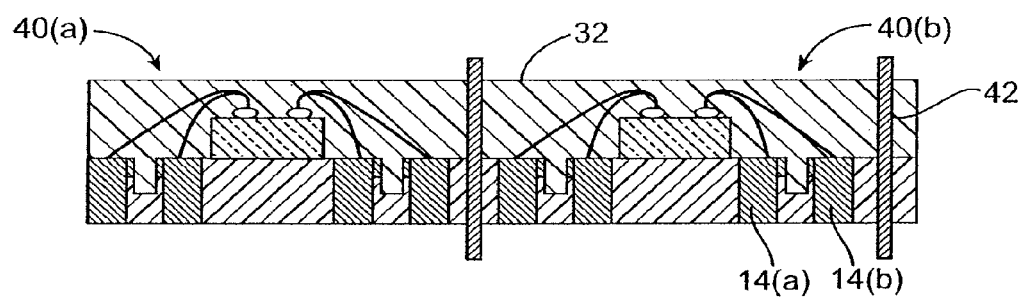

Referring to FIG. 1G, after depositing the encapsulating material 32, a second cutting element 42 (which may be the same as or different from the first cutting element 20 described above) may be used to separate the formed packages 40(a), 40(b) from each other. The second cutting element 42 may cut through the encapsulating material 32, and the substrate 22. This process may be referred to as "singulation".

Figure 1H:
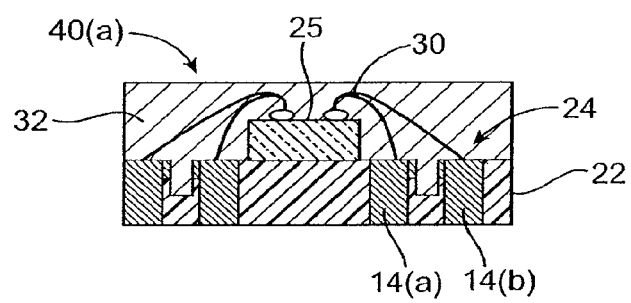

FIG. 1H shows a side cross-sectional view of a semiconductor die package 40(a) according to an embodiment of the invention after singulation. As shown in FIG. 1H, in the package 40(a), the sides of the encapsulating material 32 are co-extensive with the sides of the substrate 22. The encapsulating material 32 also covers the semiconductor die 25 as well as the wires 30. The first and second conductive portions 14(a), 14(b) are electrically isolated from each other and form electrical terminals at the bottom of the package 40(a).

Figure 1I:
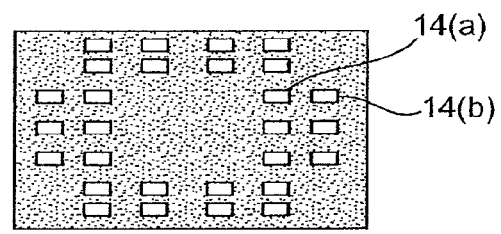
FIG. 1I is a bottom view of a semiconductor die package according to an embodiment of the invention.

As shown in FIG. 1I, the first and second conductive portions 14(a), 14(b) may form electrical terminals at the bottom of the package 40(a). The terminals corresponding to the first and second conductive portions 14(a), 14(b) may correspond to conductive lands on a printed circuit board (not shown).

The semiconductor die package 40(a) shown in FIG. 1I can be readily mounted on the circuit board (not shown) to form an electrical assembly. Solder can be deposited on the exposed surfaces of the first and second conductive portions 14(a), 14(b), and/or on the corresponding conductive lands on the circuit board. The semiconductor die package 40(a) can then be mounted to the circuit board like a flip chip.

FIG. 1J shows a rail structure 50 that can hold many substrates 22 during the package formation process. The rail structure 50 includes many cutting reference grooves 50(a). The grooves 50(a) can be used to help guide the previously described first cutting element 20 so that the optimal cutting depth can be determined before the intermediate portion between the first and second conductive portions is cut. The grooves 50(a) may be referred to as "saw street references" in some cases.

FIG. 1K shows a side view of a reference groove 50(a) in a rail structure 50. As shown, the groove 50(a) extends through part of the thickness of the frame structure 50.

FIG. 1L shows horizontal and vertical cutting lines. These lines 62 define cutting paths for the first cutting element as it cuts the intermediate portion isolating the first and second conductive portions of the leadframe structure in the substrate 22.

When cutting is performed through the cutting lines, a saw blade, for example, can cut through only part of the rail structures 50 so that they can remain intact, and the various substrates 22 can be further processed. As an alternative to using a saw and reference grooves 50(a), one can use a laser to cut the previously described intermediate portions that are present between the first and second conductive portions. A laser beam can be used to specifically cut the intermediate portions, without using reference grooves.

The embodiments described above have a number of advantages. As noted above, by providing a cavity in between first and second conductive portions of a leadframe structure and then filling it with an encapsulating material, the encapsulating material can "lock" to the premolded substrate. This helps to ensure that the formed die package is sturdy and robust. Also, die packages with multiple electrical terminals can be formed quickly and efficiently using embodiments of the invention. In addition, embodiments of the invention can form at least two rows of MLP packages with minimized package dimensions, and without exposed die attach pads (DAPs).

In the embodiments described with respect to FIG. 1A-1L, the semiconductor die is inside of a region defined by the internal portions of the leads. In other embodiments of the invention, it is possible to provide for a semiconductor die package having a configuration whereby the semiconductor die overlaps with portions of the leads. This type of semiconductor die package may also be a dual row MLP package. The improved dual row MLP package allows for a higher pin count given the same package size, without sacrificing thermal performance. The improved dual row MLP package is also smaller than comparable packages with the same number of pins without sacrificing thermal performance. These additional embodiments are described with reference to FIGS. 2A-2E.

Figure 2A:
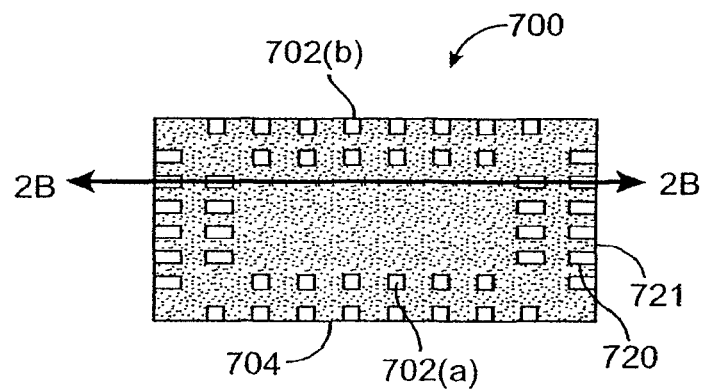
FIG. 2A shows a bottom view of another semiconductor die package according to an embodiment of the invention.

FIG. 2A shows a bottom view of a semiconductor die package 700 according to an embodiment of the invention. The semiconductor die package 700 includes a leadframe structure 720 including a plurality of inner first conductive portions 702(a) and a plurality of outer second conductive portions 702(b). As shown, the second conductive portions 702(b) encircle the first conductive portions 702(a). As in the prior embodiments, a molding material 704 forms a substrate 721 with the leadframe structure 720. Exterior surfaces of the molding material 704 are substantially coplanar with exterior surfaces of the first and second conductive portions 702(a), 702(b) of the leadframe structure 720.

Figure 2B:
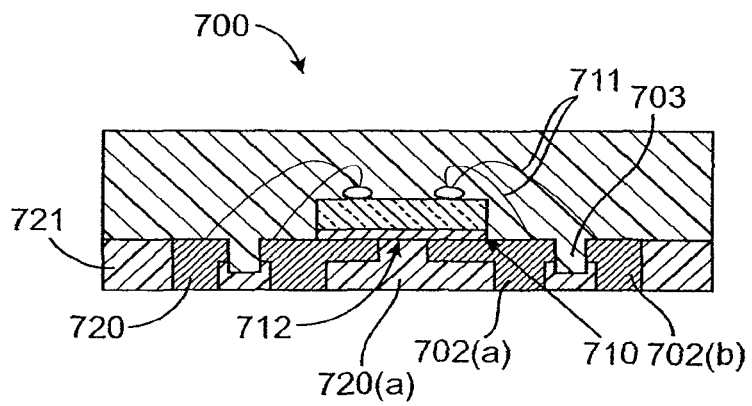
FIG. 2B shows a side-cross-sectional view of the semiconductor die package shown in FIG. 2A.

A side cross-sectional view of the semiconductor die package 700 is shown in FIG. 2B. FIG. 2B is a cross-sectional view along the line 2B-2B in FIG. 2A. The semiconductor die package 700 includes a semiconductor die 710 that is mounted on a substrate 721 using a die attach material 712 such as solder or a non-conductive adhesive. In this example, the bottom of the semiconductor die 710 is not electrically coupled to the first conductive inner portion 70(a). As in the embodiments above, the substrate 721 includes the molding material 704 and the leadframe structure 720, and there are cavities 703 that are formed in the substrate 721. The cavities 703 are between respective first and second conductive portions 702(a), 702(b) and are formed by cutting intermediate portions of the leadframe structure 720 that are between the first and second conductive portions 702(a), 702(b). Cutting processes are described above in FIGS. 1C and 1D above and any of the above-described cutting processes can be used here.

Then, process steps including die attach, wire bonding, encapsulation, and singulation may be performed. Such process steps are described above with respect to FIGS. 1E to 1H. These descriptions are incorporated herein.

Unlike the previously described package that is shown in FIG. 1G, in this embodiment, the semiconductor die 710 is mounted on the substrate 721 so that it is over and overlaps with the inner first conductive portions 702(a), and an etched region 720(a) of the leadframe structure 720. Wires 711 electrically couple the semiconductor die 710 to the upper surfaces of the first and second conductive portions 702(a), 702(b).

Figure 2C:
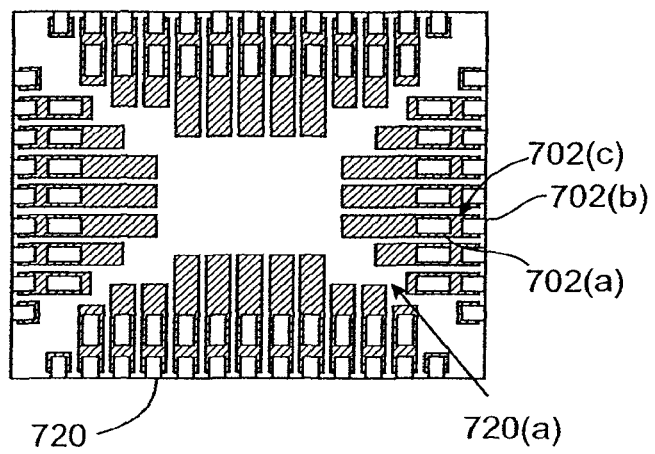
FIG. 2C shows a bottom view of a leadframe structure according to an embodiment of the invention.

FIG. 2C is a bottom view of the leadframe structure 720 that is used in the substrate 721. As shown, the first and second conductive portions 702(a), 702(b) are formed after etching. Intermediate portions 702(c) are between the first and second conductive portions 702(a), 702(b). Together, a first and second conductive portion 702(a), 702(b) and an intermediate portion 702(c) between the first and second portions 702(a), 702(b) can form a gap. As noted above, the intermediate portion 702(c) is eventually cut and is filled with an encapsulating material. The leadframe structure 720 also includes etched regions 720(a) where material from the leadframe structure 720 is removed.

Figure 2D:
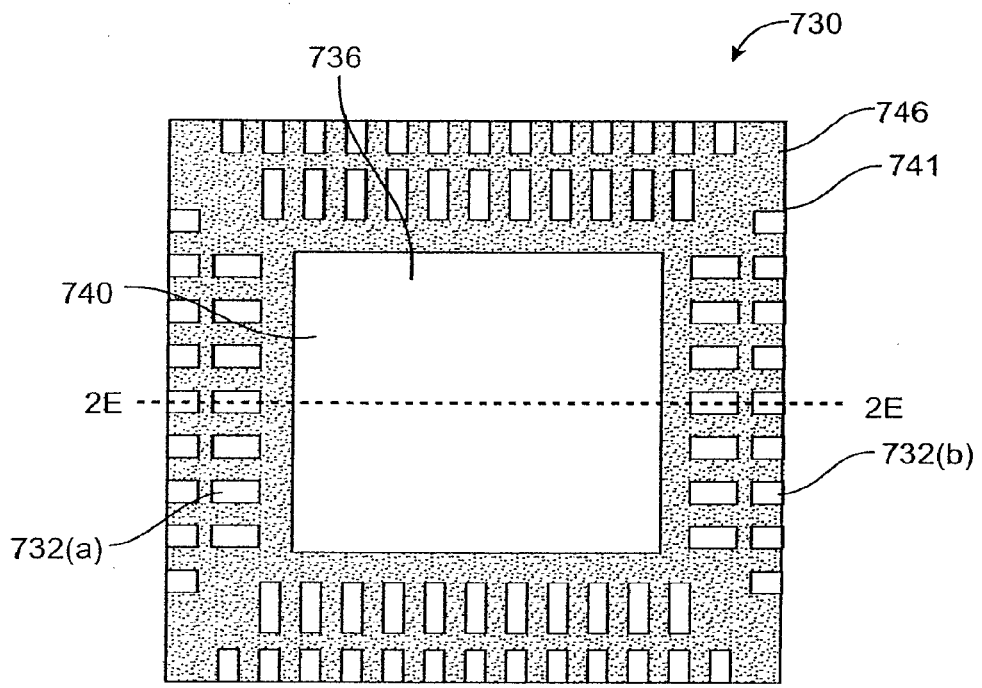
FIG. 2D shows a bottom view of a semiconductor die package according to another embodiment of the invention.

FIG. 2D shows a bottom view of a semiconductor die package 730 according to another embodiment of the invention. As in the prior embodiments, the semiconductor die package 730 includes a leadframe structure 740 and a molding material 746. Together, these components can form a substrate 741. The leadframe structure 740 includes a central portion 736 which may include a die attach region including a die attach pad (DAP), as well as inner first conductive portions 732(a) and outer second conductive portions 732(b). The second conductive portions 732(b) may encircle the inner first conductive portions 732(a), and the first and second conductive portions 732(a), 732(b) may be electrically isolated from each other as described above.

Figure 2E:
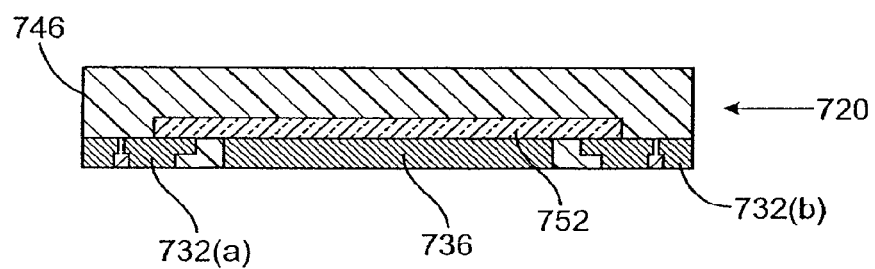
FIG. 2E shows a side cross-sectional view of another semiconductor die package according to another embodiment of the invention.

As shown in FIG. 2E, a semiconductor die 752 is mounted to the die attach region of the central portion 736 using a die attach material or the like. The semiconductor die 752 overlaps with many of the first conductive portions 732(a) as well as the central portion 736. Each of the second conductive portions in the plurality of second conductive portions 732(b) is electrically isolated from a corresponding first conductive portion in the plurality of first conductive portions 732(b). FIG. 2E is a cross-sectional view along the line 2E-2E in FIG. 2D. The previously described wires are omitted from FIG. 2E for clarity.

The embodiments described with respect to FIGS. 2A-2E have a number of advantages. Embodiments of the invention allow for a higher pin count without sacrificing thermal performance. Embodiments of the invention can alternatively be smaller than a comparable package with the same number of pins, without sacrificing thermal performance. For example, a small package can be formed using such embodiments, even though the die that is used in the package is relatively large. Other designs are not able to incorporate a large semiconductor die into a package without increasing the size of the package. This is because in other designs, the semiconductor die is placed on a DAP (die attach pad) of comparable size. However, in the above described embodiments, the semiconductor die can have lateral dimensions that are larger than a DAP or may not have a DAP at all, while overlapping with at least some of the conductive portions (leads) of the leadframe structure. Thermal performance is not sacrificed and can be improved, since heat is dissipated not only through a DAP, but also through the leads (conductive portions) of the leadframe structure.

Table 1 illustrates the advantages provided by the specific embodiments described with respect to FIGS. 2A-2E, as compared to the specific embodiments described above in FIGS. 1A-1L (Embodiment 1). As shown in Table 1, the embodiments that are specifically described with respect to FIGS. 2A-2E (Embodiment 2) can be smaller, can have higher pin counts, and can have better thermal properties than the embodiments specifically described in FIGS. 1A-1L.

TABLE 1

| Characteristic | Embodiment 1 | Embodiment 2 |
| --- | --- | --- |
| Size (pitch) | 7 mm × 6 mm (0.65 mm pitch) | 6 mm × 5 mm (0.4 mm-0.5 mm pitch) |
| Pin count | 56 pin | 80 pin |
| Limit of pitch | Min 0.5 mm | Min 0.4 mm |
| Thermal resistance— single board (degrees C/W) | DAP not soldered with 56 pins—82.6 | DAP not soldered with 80 pins—78.7 DAP not soldered with 64 pins—72.1 |
| Thermal resistance— multiboard (degrees C/W) | DAP not soldered with 56 pins—45.1 | DAP not soldered with 80 pins—35.3 DAP not soldered with 64 pins—32.8 |

II. Die Packages Including Multiple Semiconductor Dice

As the feature sizes of MLP (microleaded package) components get smaller and smaller, designs can be constrained by the metal to metal clearance and dimensional tolerance capabilities of etched and half-etched frame technologies. This brought about the introduction of bump-chip carrier (BCC) technology which currently does not offer any layout restrictions, but would typically use wet etching processes. The use of wet etching processes is not preferred.

Embodiments of the invention use premolded substrates incorporating leadframe structures. The substrates can accommodate multiple semiconductor dice. Typically, a multichip package requires the use of a dedicated substrate layout. A dedicated substrate layout is typically specific only to that particular multichip package. Embodiments of the invention are able to remove this constraint by enabling the reuse of the same premolded substrate design to accommodate multiple semiconductor die layouts. An exposed pad layout can also used to enhance the thermal performance of the semiconductor die package in embodiments of the invention. Other layout concepts include the ability of the semiconductor die package to provide access to a drain contact of a semiconductor die (e.g., if the semiconductor die comprises a vertical power MOSFET).

In one embodiment of the invention, a premolded substrate including a first surface and a second surface is obtained. The premolded substrate includes a leadframe structure and a molding material. The leadframe structure comprises a pad region. An exterior surface of the pad region and an exterior surface of the molding material are substantially coplanar and coincide with the second surface of the premolded substrate. At least two semiconductor dice are attached to the substrate. Preferably, the at least two semiconductor dice are attached to the molding material of the substrate, and are connected to leads at the lateral edges of the substrate using bond wires and/or conductive clips.

FIGS. 3A to 3E show steps in the formation of a semiconductor die package including a premolded substrate and multiple semiconductor dice.

FIG. 3A shows a top view of a premolded substrate 100 according to an embodiment of the invention. The premolded substrate 100 comprises a molding material 102 and a leadframe structure 104. At least an external surface of the molding material 102 and an external surface of the leadframe structure 104 are substantially coplanar. The leadframe structure 104 includes a number of leads 104(a) that are at and terminate at the outer lateral edge regions of the substrate 100. The leads 104(a) in this example are present at each of the four side edge regions of the substrate 100, and are exposed through and do not extend past a molding material 102. Exterior surfaces of the leads 104(a) can be substantially coplanar with the exterior surface of the molding material 102.

As shown by the dotted lines in FIG. 3A, the leadframe structure 104 includes a downset central region that is inside of the leads 104(a). The downset central region may be formed by a partial etching process. The top surface of the downset central region is covered with the molding material 102.

The upper surface of the molding material 102 can form a die attach region 100(a) where two or more semiconductor dice (not shown) can be mounted. Since the upper surface of the molding material 102 is used as a die attach region 106 and no conductive die attach pads are used as mounting surfaces in the illustrated embodiment, the premolded substrate 100 can support multiple semiconductor dice without requiring that those dice be in a particular layout. Several multi-die configurations can be used without changing the external lead layout.

Referring to FIG. 3B, after the substrate is formed, semiconductor dice 110, 112, 114 are mounted on the die attach region 106 of the substrate 100. A non-conductive (or conductive) adhesive can be used to attach the semiconductor dice 110, 112, 114 to the die attach region 106. The semiconductor dice can be any of the semiconductor dice described above. Advantageously, the dice 110, 112, 114 can be placed on the molding material 102 of the substrate 100 in any suitable arrangement.

Referring to FIG. 3C, after the semiconductor dice 110, 112, 114 are mounted to the substrate 100, the top surfaces of the semiconductor dice 110, 112, 114 can be electrically coupled to the leads 104(a) to form a semiconductor die package 121. If desired, an optional encapsulating material may be deposited and cured over the semiconductor dice 110, 112, 114 as well as any conductive structures (e.g., wires, clips, etc.) that are used to couple the leads 104(a) to the top surfaces of the semiconductor dice 110, 112, 114.

FIG. 3C specifically shows a number of wirebonds 118 coupling electrical terminals (not shown) at the top surfaces of the semiconductor dice 110, 112, 114 to the lateral leads 104(a) of the leadframe structure 104. The wirebonds 118 can be formed by wirebonding processes, which are well known in the art. As an alternative, conductive clips and solder could be used to couple the electrical terminals at the top surface of the semiconductor dice 110, 112, 114 to the leads 104(a).

FIG. 3D shows a bottom view of the substrate 100. The bottom of the substrate 100 and the leadframe structure 104 includes a pad region 104(b) which is opposite the die attach region 106. The pad region 104(b) is large and occupies a major portion of the second surface 100(b) of the substrate 100, and is downset with respect to the leads 104(a) at the edges of the substrate 100. In this example, the exposed pad region 104(b) can occupy at least about 50% of the lateral area of the substrate 100. The large pad region 104(b) provides the formed package with good heat transfer characteristics as the large pad region 104(b) of the leadframe structure 104 acts has a heat sink.

FIG. 3E shows a side, cross-sectional view of the substrate 100 along the line 3E-3E in FIG. 3A. The pad region 104(*b*) has an exterior surface 104(*b*)-1, which occupies a substantial portion of the bottom surface of the substrate 100. The exterior surface 104(*b*)-1 of the pad region 104(*b*) is exposed by and is substantially coplanar with an exterior surface 102(*a*) of the molding material in the substrate 100. In this example, the molding material 102 electrically isolates the semiconductor dice 110, 112, 114 from the pad region 104(*b*). The exposed pad region 104(*b*) can be soldered to a circuit board (not shown) if desired to provide a thermal path from the semiconductor dice 110, 112, 114 to the circuit board.

As shown in FIG. 3E, the leads 104(*a*) have thicknesses which are substantially equal to the maximum thickness of the molding material 102. In addition, in the substrate 100, an internal surface of the pad region 104(*b*) of the leadframe structure 104 is covered by the molding material 102. The molding material 102 has a thickness "T" and in this example, the combined thickness T and the thickness of the pad region 104(*b*) equals the thickness of the substrate 100.

The embodiments described with respect to FIGS. 3A-3E have a number of advantages. First, the large exposed pad region 104(*b*) improves the thermal performance of the formed semiconductor die package by providing a large heat conduction path from the semiconductor dice 110, 112, 114. In addition, the large die attach region 106 of the substrate 100 does not have conductive pads so that various multi-die layouts can be provided in a package, even though only one substrate design is used.

FIGS. 4A-4F illustrate a process for forming another embodiment of the invention.

Figure 4A:
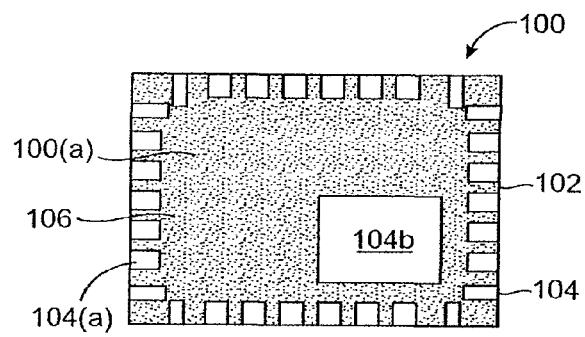
FIGS. 4A-4C show top plan views of another semiconductor die package according to an embodiment of the invention.

FIG. 4A shows another premolded substrate 100 according to an embodiment of the invention. The substrate 100 includes a leadframe structure 104 including a pad region 104(*b*) and leads 104(*a*), and a molding material 102. A die attach region 106 at an upper surface 100(*a*) of the premolded substrate 100 can include a surface of the pad region 104(*b*) and can support a number of semiconductor dice (not shown). The dotted lines in FIG. 4B show the outline of the leadframe structure 104, and the leadframe structure 104 may be formed by a partial etching process.

Unlike the substrate 100 described above with reference to FIG. 3A, in this example, the pad region 104(*b*) has opposing surfaces which coincide with the opposing surfaces of the substrate 100. In this embodiment, the die attach region 106 includes both an exterior surface of the pad region 104(*b*) and an exterior surface of the molding material 102.

In this example, the pad region 104(*b*) extends through the entire thickness of the substrate 100, and may provide for a conductive and/or thermal path for a semiconductor die (not shown) on the pad region 104(*b*) through the substrate 100 and to an underlying circuit board (not shown). In some embodiments, the pad region 104(*b*) may be electrically coupled to an input or output terminal of an electrical device in a semiconductor die (not shown in FIG. 4A. For example, the pad region 104(*b*) may be electrically coupled to the drain region of a MOSFET in a semiconductor die.

Figure 4C:
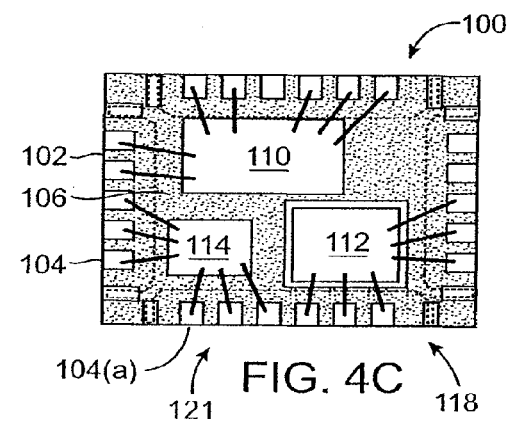
Figure 4B:
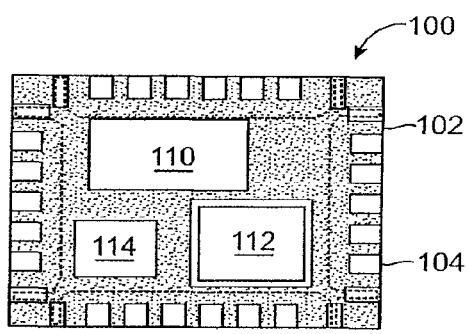

As shown in FIG. 4B, a number of semiconductor dice 110, 112, 114 can be placed on the die attach region 106. One of the semiconductor dice, semiconductor die 112, may be attached to the pad region 104(*b*), while the other semiconductor dice 110, 114 may be attached to molding material 102. The semiconductor die 112 could be a vertical device such as a vertical MOSFET. As described above, such vertical devices have an input at one surface of the die and an output at another opposite surface of the die. The other semiconductor dice 110, 114, may include horizontal devices. As noted above, a horizontal device has an input and an output at the same surface of the die.

Referring to FIG. 4C, after the semiconductor dice 110, 112, 114 are mounted to the substrate 100, a number of wirebonds 118 are formed to connect the leads 104(*a*) to the upper surfaces of the semiconductor dice 110, 114, 112. A semiconductor die package 121 is then formed.

Figure 4D:
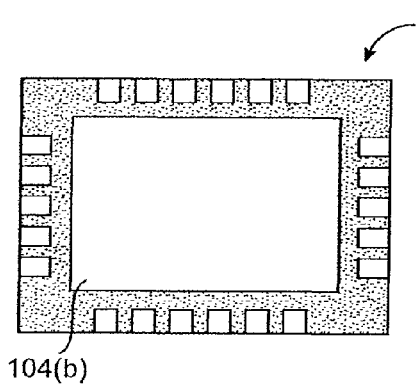
FIG. 4D shows a bottom plan view of a substrate according to an embodiment of the invention.

FIG. 4D shows a bottom view of the substrate 100. As shown in FIG. 4D, the exposed surface of the pad region 104(*b*) is larger at the bottom surface 100(*b*) of the substrate 100 than the exposed surface of the pad region 104(*b*) at the top surface 100(*a*) of the substrate 100. In other embodiments, the exposed surface of the pad region 104(*b*) at the top surface 100(*a*) of the substrate 100 can be larger or the same size as the exposed surface of the pad region 104(*b*) at the bottom surface of the substrate 100.

Figure 4E:
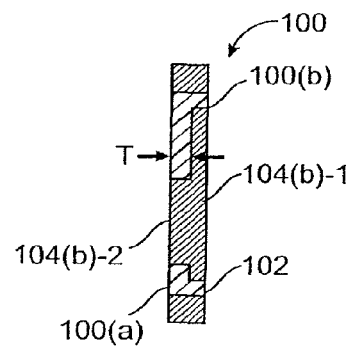
FIG. 4E shows a side cross-sectional view of a substrate according to an embodiment of the invention.

FIG. 4E shows a side view of the substrate 100 shown in FIG. 4A. As shown in FIG. 4E, first and second opposing surfaces 104(*b*)-1, 104(*b*)-2 of the pad region 104(*b*) are substantially coplanar with exterior surfaces of the molding material 102. The molding material 102 may have a thickness "T" at an etched portion of the pad region 104(*b*). Thus, the molding material 102 can have a thickness that is equal to the thickness of the substrate 100 at some locations and can have the thickness "T" at other locations.

The embodiments described with respect to FIGS. 4A-4E have a number of advantages. First, the large exposed pad region 104(*b*) improves the thermal performance of the formed semiconductor die package by providing a large heat conduction path from the semiconductor dice 110, 112, 114. In addition, the large die attach region 106 of the substrate 100 can serve as a conductive and thermal path for one or more semiconductor dice mounted on the substrate 100.

The embodiments shown in FIGS. 3A-3E and 4A-4E have other advantages in addition to those already mentioned above. First, since a DAP is not required, many different semiconductor die configurations can be used, without changing external lead configurations. The clearance between dice on the substrate can be minimized, since a DAP is not required thereby providing for a more compact package. Second, since a DAP is not required, a tie bar that is used to connect to the DAP during processing is not required. This can simplify processing. Third, the area occupied by an area associated with an exposed pad in a substrate according to an embodiment of the invention can be maximized. As shown above, the exposed pad can occupy almost the entire backside of the substrate that supports the semiconductor dice. Fourth, as shown above, the leadframe structure can have an exposed surface in the substrate to connect to the drain or other terminal in an electrical device in a semiconductor die that is mounted on the substrate. This can be done while maximizing the exposed pad area at the opposite side of the substrate, which is eventually soldered to an appropriate circuit board.

III. Method of Manufacturing a Semiconductor Die Package Using a Stamped Leadframe Structure Some of the premolded substrate embodiments described above use an etched leadframe structure (e.g., the embodiments described with respect to FIGS. 1A-1H) and are formed using expensive cover tape. Using etched leadframes and cover tape is expensive. Tape is a relatively expensive component in the manufacturing process, and the taping and etching processes increase the manufacturing time, complexity, and cost of a premolded substrate. It would be desirable to provide for a process for forming a premolded substrate that does not rely on the use of cover tape or etched leadframe structures.

To address these problems, embodiments of the invention can use a stamped leadframe structure apparatus to form a premolded substrate. Cover tape and etched leadframes are not needed to form the premolded substrate so that the final package that is produced is less expensive than a package that is formed using an etched leadframe and cover tape. Because of the processing efficiencies achieved using embodiments of the invention, the resulting semiconductor die packages produced according to embodiments of the invention can cost about 42% less than comparable semiconductor die packages using premolded substrates with etched leadframe structures.

In addition to addressing the above noted problems, it would also be desirable to improve the thermal performance of semiconductor die packages including premolded substrates. In embodiments of the invention, thermal performance is good, because heat can be transmitted from a semiconductor die to the leads of a leadframe structure.

It would also be desirable, in some cases, to increase the area of a solder joint that is used to attach a semiconductor die package to a circuit board. Using embodiments of the invention, a concave structure can be formed in the substrate. With a concave structure, it is possible to increase the size of a solder joint and an exposed pad can be protected from possible electrical shorting. This is explained in further detail below.

Embodiments of the invention can also use flip chip attachment methods using a non-conductive adhesive or a solder bump and reflow process. The leadframe structure design is relatively simple, and it is also possible to increase the pin count for a given package size. It is also possible to use a larger die in the semiconductor die package, since a DAP (die attach pad) is not required in embodiments of the invention.

In one embodiment, the method comprises forming a premolded substrate. The step of forming the premolded substrate comprises (i) placing a leadframe structure between at least a first molding die and a second molding die, (ii) contacting the leadframe structure with the first and second molding dies, and (iii) forming a molding material around the leadframe structure. The leadframe structure may be a non-etched leadframe structure, and the first and second molding dies may form part of a molding apparatus or tool. After the premolded substrate is formed, a semiconductor die is attached to the premolded substrate. Wirebonds, conductive clips, solder structures (e.g., solder balls) or the like can be used to electrically couple the semiconductor die to leads in the premolded substrate. After the semiconductor die is electrically and mechanically coupled to the premolded substrate, the semiconductor die is then encapsulated in an encapsulating material to form a semiconductor die package. The encapsulating material may be the same or different than the previously described molding material. For example, the encapsulating material may be different than the previously described molding material to improve the thermal performance of the formed die package and to decrease manufacturing costs.

In a specific embodiment, the method for forming a semiconductor die package can use the following processes: a) a first molding process to form a premolded substrate, b) a substrate cleaning process which may use a plasma, laser, or chemical etching and/or deflash process, c) a die attach process, d) a plasma cleaning process, e) a wire bonding process, e) a second molding or encapsulation process, and f) a singulation process. Each of these specific processes is described in further detail below.

Figure 5:
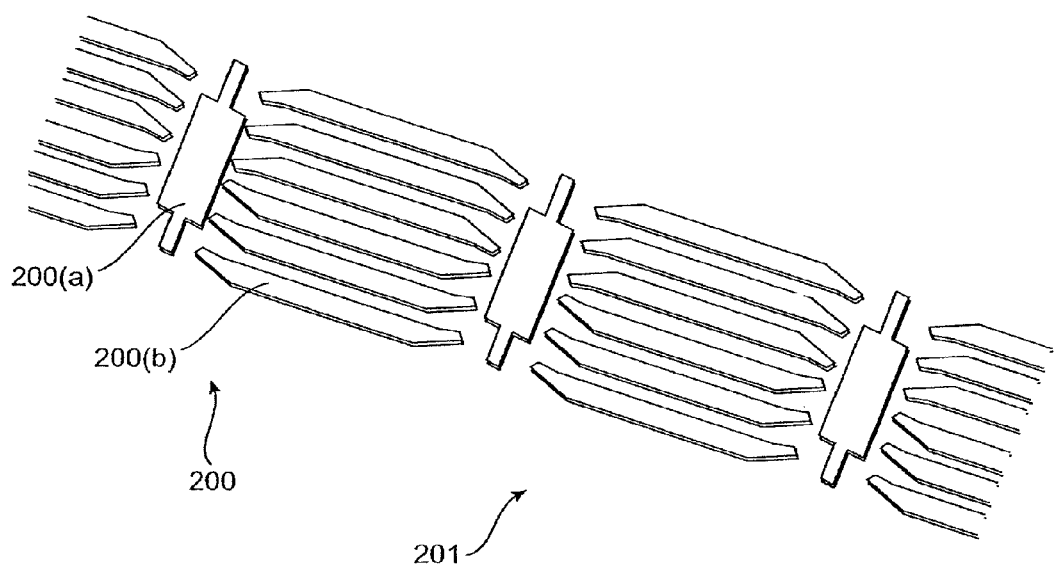
FIG. 5 shows a perspective view of a leadframe structure array.

FIG. 5 shows a leadframe structure array 201 including a number joined leadframe structures 200. Each leadframe structure 200 in the leadframe structure array 201 includes uncut leads 200(*b*) and a major region 200(*a*). The uncut leads 200(*b*) extend on opposite sides of the major region 200(*a*). The leadframe structures 200 in the leadframe structure array 201 will eventually be used in individual semiconductor die packages and will eventually be separated from each other. The leadframe structures 200 and the leadframe structure array 201 may have any of the characteristics or features of any of the above described leadframe structures.

Figure 6A:
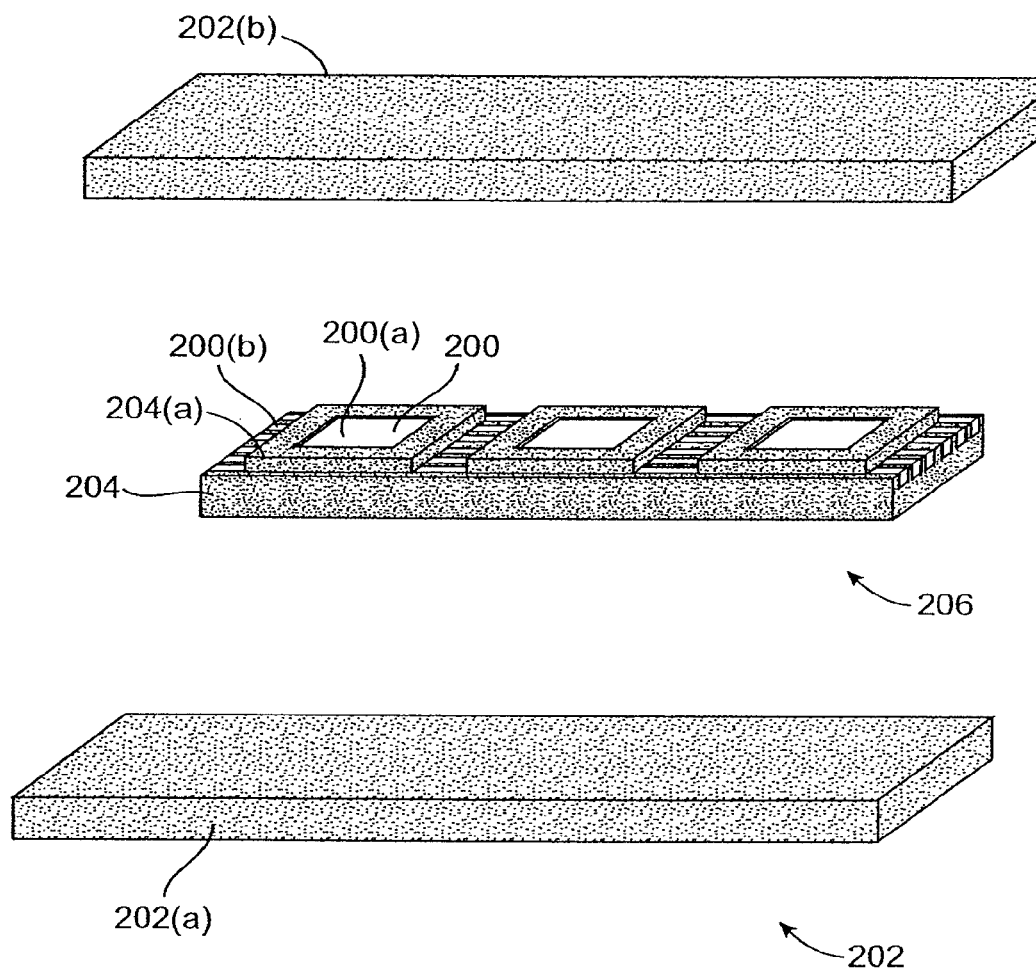
FIGS. 6A-6I show perspective views of die packages as they are being formed.

FIG. 6A shows a perspective view of a molded leadframe structure array 206 after it is formed in a mold tool 202. The mold tool 202 includes a first molding die 202(*a*) and a second molding die 202(*b*). An inlet for introducing an unsolidified molding material and fluid outlet for excess molding material may be provided in the mold tool 202. In some cases, heating elements (not shown) may also be provided to heat the molding material so that it can flow. In general, mold tools are well known in the art.

To form the molded leadframe structure array 206, the previously described leadframe structure array 201 can be inserted between the first and second molding dies 202(*a*), 202(*b*). A molding material 204 is formed around the leadframe array structure 200 and solidifies to form a molded leadframe structure array 206. The molding material 204 exposes external surfaces of the leads 200(*b*) and the major regions 200(*a*). A slightly raised rim structure 204(*a*) may be present around each major region 200(*a*). Some exterior surfaces of the molding material 204 and the leadframe structures in the leadframe structure array 200 are substantially coplanar with each other.

The mold tool 202 has two mold dies 202(*a*), 202(*b*) which can have appropriate configurations to shape the molding material 204 in a desired manner. The top mold 202(*b*) can have surfaces that are in direct contact with the major regions 200(*a*), surfaces of the uncut leads 200(*b*), and any other surfaces that are not supposed to be covered with the molding material. By using the molding dies 202(*a*), 202(*b*), it is not necessary to use expensive cover tape or etched leadframe structures when forming a premolded substrate. This reduces the cost of the premolded substrate, and therefore the semiconductor die package that is formed from the premolded substrate. This also reduces the number of steps needed to form the molded portion of the premolded substrate, thus saving processing time and expense. Lastly, using molding dies 202(*a*), 202(*b*), it is possible to form a rim of molding material around a major region 200(*a*) thereby forming a concave structure.

Figure 6B:
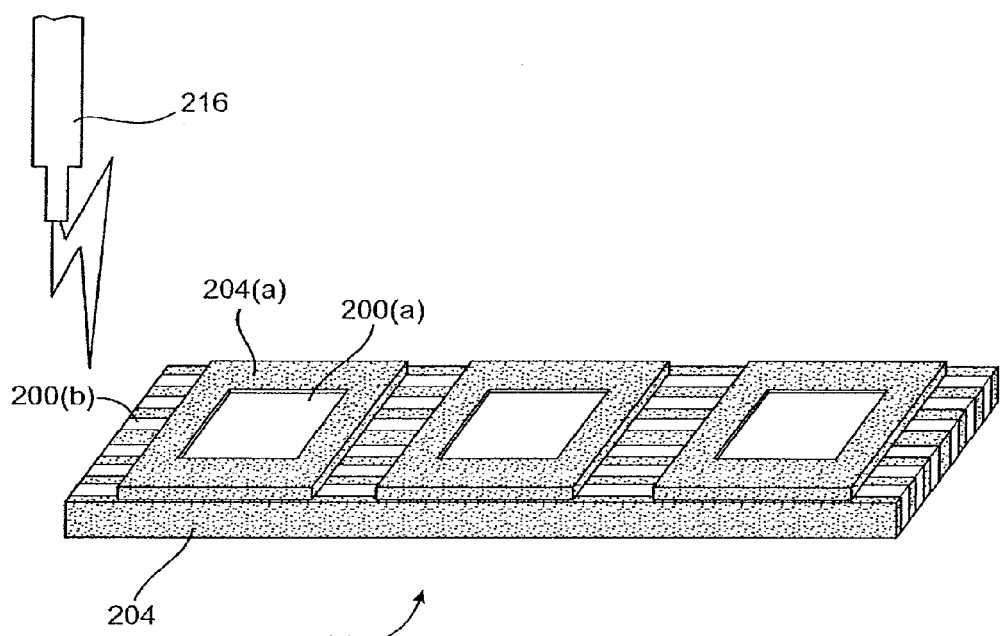

As shown in FIG. 6B, a cleaning process can be used to increase the adhesion of an encapsulation material to the molding material 204 and the exposed leads 200(*b*). Any suitable cleaning process can be used. For example, a plasma cleaning process, a laser cleaning process, a chemical etching process, a mechanical deflash process, etc. can be used. Suitable cleaning process parameters may be determined by those of ordinary skill in the art. FIG. 6B specifically shows a cleaning apparatus 216 as it cleans the upper surface of the molded leadframe array 206.

Figure 6C:
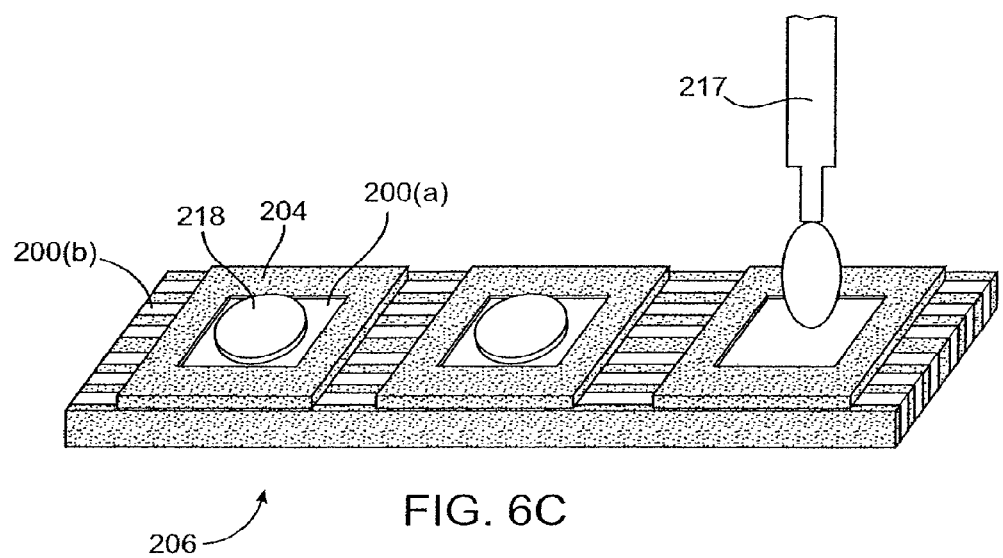

As shown in FIG. 6C, after the molded leadframe array 206 is cleaned with the cleaning apparatus 216, an adhesive 218 (or solder of the like) can be deposited on the exterior surfaces of the major regions 200(*a*) using an adhesive deposition apparatus 217. The adhesive 218 may comprise any suitable commercially available adhesive including an epoxy adhesive. The adhesive 218 may be filled or unfilled, and may or may not include a conductive material.

Figure 6D:
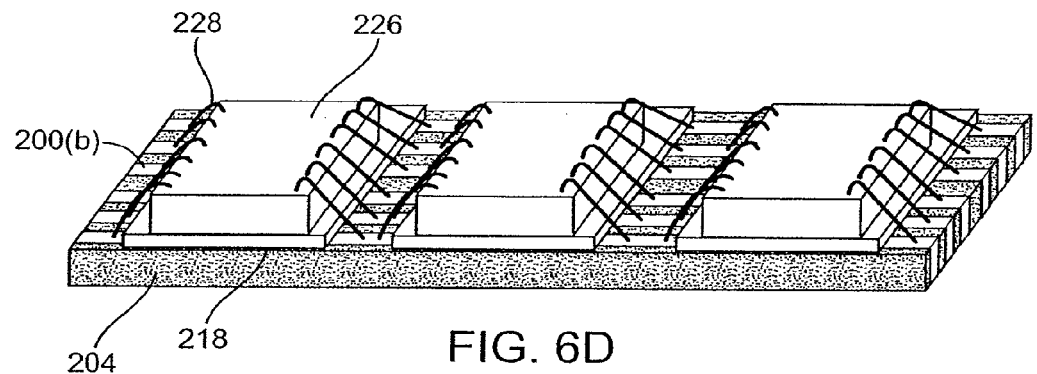

As shown in FIG. 6D, after the adhesive 218 is deposited on the major regions 208(*a*), one or more semiconductor dice 226 are mounted on the major regions 200(*a*). The semiconductor die 226 that is electrically coupled to each major region 200(*a*) can be positioned over and may overlap with the leads 200(*b*). However, the semiconductor die 226 may be electrically isolated from the leads 200(*b*), due to the presence of the rim of molding material 204(*a*). Because the semiconductor die 226 can actually be positioned over a portion of the leads 200(*b*), the size of the semiconductor die 226 is not limited to the size of the major regions 200(*a*). This allows for the incorporation of larger semiconductor dice in the semiconductor die packages according to embodiments of the invention.

Also as shown in FIG. 6D, wirebonds 228 are then formed between electrical terminals (not shown) at the topside of the semiconductor dice 226 and the leads 200(*b*). In other embodiments, instead of wirebonds 228, conductive clips can be used to electrically and mechanically couple the leads 200(*b*) to the upper surfaces of the semiconductor dice 226.

Figure 6E:
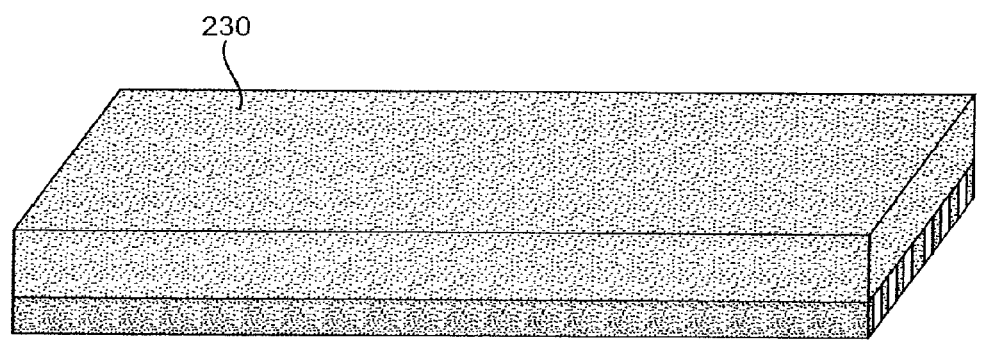

As shown in FIG. 6E, the resulting assembly is then overmolded with an encapsulating material 230 to form an overmolded assembly 232. FIG. 6E shows a top, perspective view the overmolded assembly 232.

Any suitable molding process may be used to form the overmolded assembly 232. For example, a molding tool with molding dies can be used to form the overmolded assembly. As in prior embodiments, the encapsulating material 230 may be the same or different than the molding material used to form the premolded substrate in the semiconductor die package.

Figure 6F:
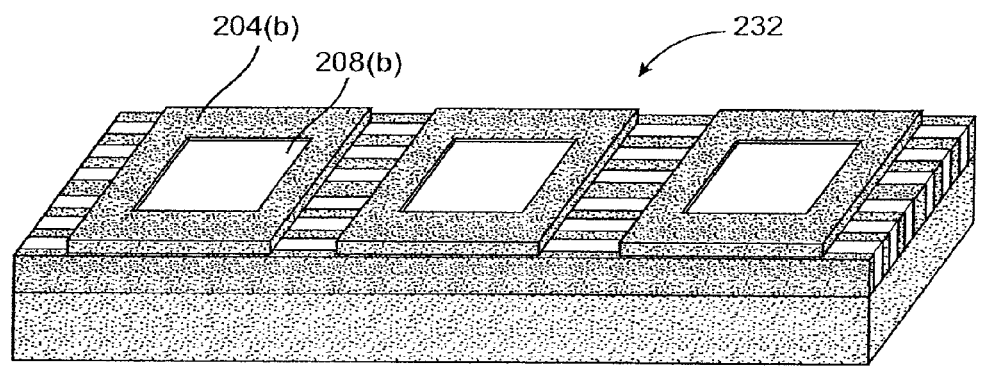

FIG. 6F shows a bottom, perspective view of the opposite side of the overmolded assembly 232 shown in FIG. 6F. As shown, there can be second rims 204(*b*) of molding material around the bottom surfaces of the major regions 208(*a*) of the leadframe structures. As will be explained in further detail below, these can form concave structures.

Figure 6G:
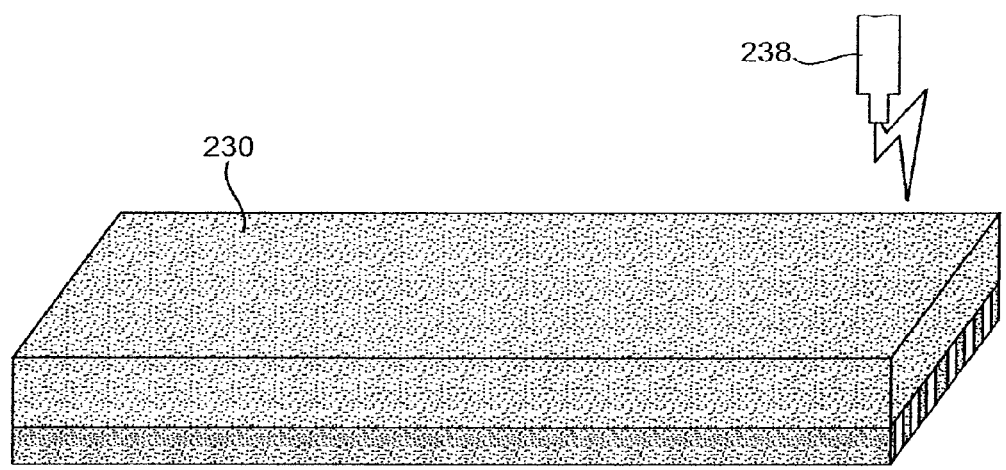

FIG. 6G shows the overmolded assembly 232 including a molding material 230 as it is being marked with a laser 238, or other suitable marking element. The overmolded assembly 232 includes a number of joined semiconductor die packages. After marking, the joined packages can be singulated with an appropriate cutting element (not shown) to separate the formed packages from each other. Suitable cutting elements include lasers, saws, punching apparatuses, or the like.

Figure 6H:
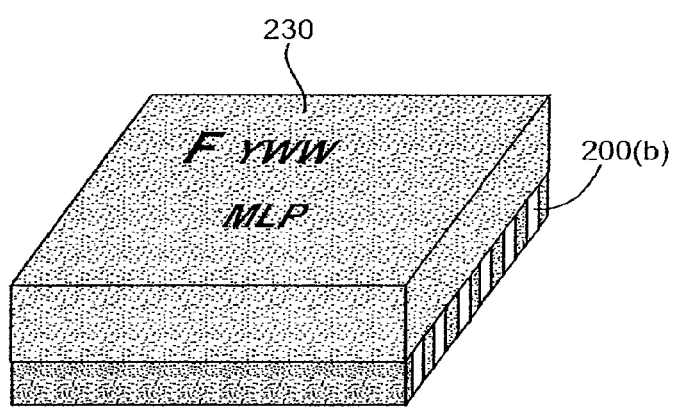
Figure 6I:
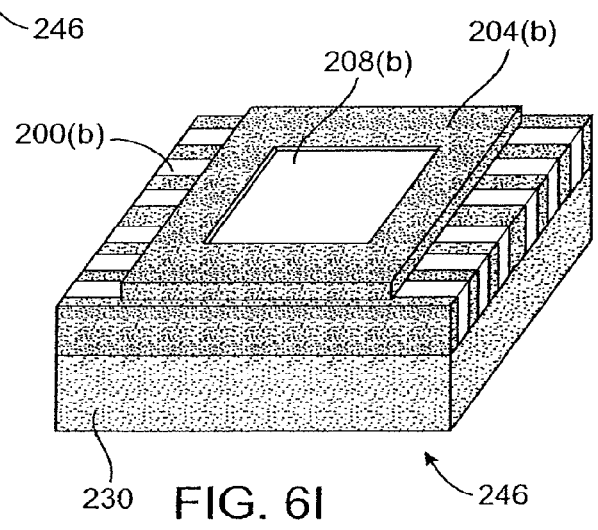

FIG. 6H shows a top, perspective view of a formed package 246, while FIG. 6I shows a bottom, perspective view of the formed package 246. As shown in FIG. 6I, the second rim 204(*b*) and the exposed surface of the major region 208(*b*) can form concave structure. The concave structure can contain solder (not shown) and can be flipped over and then mounted to a printed circuit board. The concave structure can be used to confine solder to a particular location, and the second rim 204(*b*) of molding material may form a barrier between solder attached to the major region 204(*b*) and the leads 200(*b*). As shown, the lateral edges of the leads 200(*b*) are substantially coplanar with and do not extend past the lateral surfaces of the molding material 204. The bottom surfaces of the leads 200(*b*) are also substantially coplanar with the surfaces of the molding material 204 that is between the leads 200(*b*).

FIGS. 7A-7D show side views of a semiconductor die package as it is being processed. The method shown in FIGS. 7A-7D is similar to the process shown in FIGS. 6A-6I.

Figure 7A:
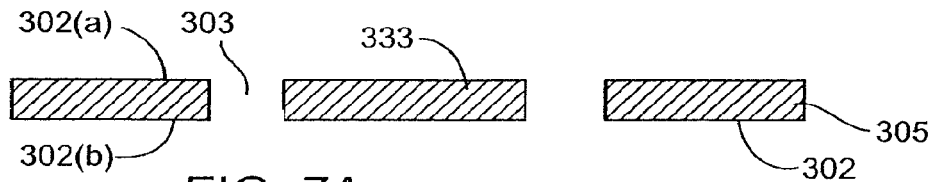
FIGS. 7A-7C show side cross-sectional views of another semiconductor die package as it is being formed.

FIG. 7A shows a leadframe structure 302 including a first surface 302(*a*) and a second surface 302(*b*) opposite the first surface 302(*a*). In this example, the leadframe structure 302 has a number of spaces 303 that are present between the leads 305, and a major central portion 333 of the leadframe structure 302. The major central portion 333 is present between sets of leads 305. The leadframe structure 302 may have the same or different characteristics as the leadframe structures described above. For example, the leadframe structure 302 may comprise a material such as copper and may be plated.

Figure 7B:
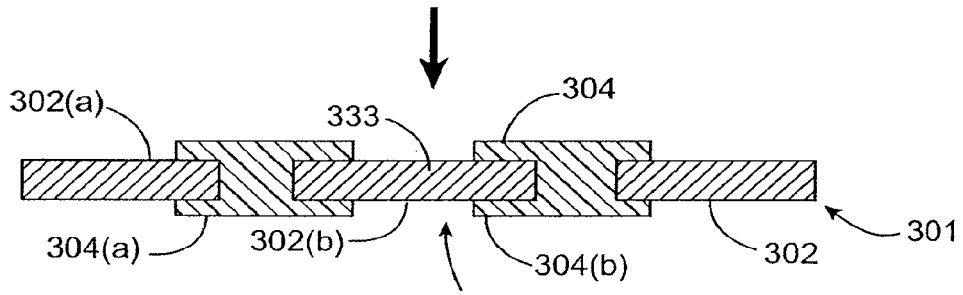

FIG. 7B shows a leadframe structure 302 after a molding material 302 has been formed on it. This may constitute a first molding process. A premolded substrate 301 is thereafter formed. The molding material 302 has two portions 304(*a*), 304(*b*), which may form a rim of molding material 304. As shown in FIG. 7B, a concave structure 307 is formed by the molding material portions 304(*a*), 304(*b*), and the bottom surface of the major central portion 333 of the leadframe structure.

Figure 7C:
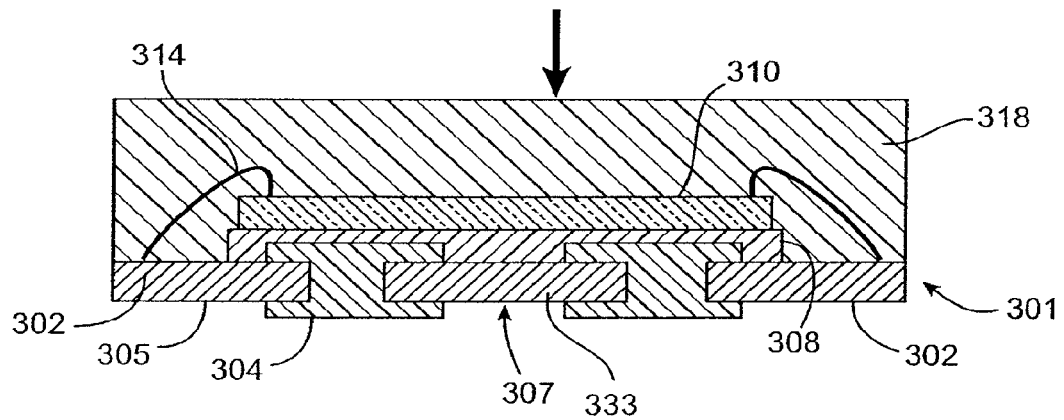

As shown in FIG. 7C, after the premolded substrate 301 is formed, a semiconductor die 310 is attached to the premolded substrate 301 using an adhesive 308, which may include a conductive or non-conductive adhesive, solder, etc. The semiconductor die 310 may comprise a horizontal or vertical device as described above. If a vertical device is present, then the adhesive may 308 may be conductive so that current can pass to or from the bottom surface of the die 310 to the adhesive 308, the major central portion 333 of the leadframe structure 302, and to an appropriate pad on a circuit board (not shown).

Then, wirebonds 314 are formed between the leads 305 of the leadframe structure 302 and electrical terminals (not shown) at the upper surface of the semiconductor die 310. The upper surface of the semiconductor die 310 may be further from the premolded substrate 301 than the opposite surface of the semiconductor die 310. An encapsulating material 318 is then formed over the semiconductor die 310 and the wirebonds 314. As shown in FIG. 7C, the lateral surfaces of the encapsulating material 318 may be coplanar with the lateral surfaces of the leads 305 of the leadframe structure 302.

Figure 7D:
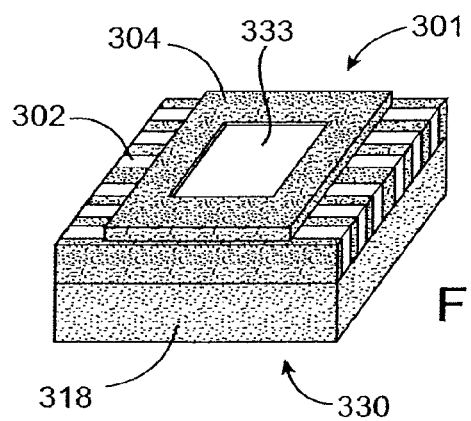
FIG. 7D shows a perspective view of the semiconductor die package formed using the process shown in FIGS. 7A-7C.

A bottom perspective view of the resulting semiconductor die package 330 is shown in FIG. 7D. The semiconductor die package 330 includes an encapsulating material 318 and a leadframe structure 302. A rim of molding material 304 is disposed around the major central portion 333 of the leadframe structure 302 to form a concave structure 301. As shown, the regions between the leads of the leadframe structure 302 are filled with the molding material 304 and the surfaces of the molding material 304 at those locations are substantially coplanar with the surfaces of the leads.

Other semiconductor die packages according to embodiments of the invention can include premolded substrates without concave structures. Such embodiments can be described with reference to FIGS. 8A-8E.

Figure 8A:
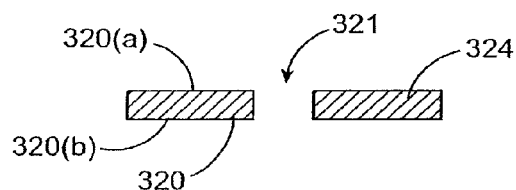
FIGS. 8A-8D show side cross-sectional views of another semiconductor die package has it is being formed.

FIG. 8A shows another side, cross-sectional view of a leadframe structure 320 including a gap 321. The leadframe structure 320 also includes a first surface 320(*a*) and a second surface 320(*b*), and leads 324 on opposite sides of the gap 321.

Figure 8D:
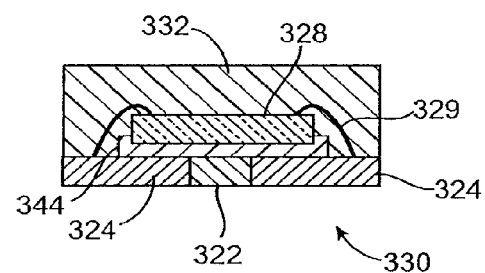
Figure 8B:
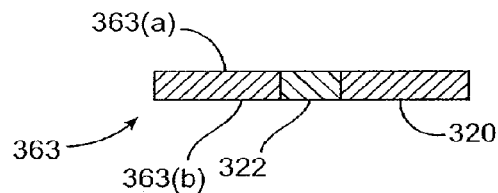

FIG. 8B shows the leadframe structure 320 after a molding process is performed. This may constitute a first molding process. As shown in FIG. 8B, a molding material 322 is disposed within the gap 321 and exterior surfaces of the molding material 322 are substantially coplanar with the first and second surfaces 320(*a*), 320(*b*) of the leadframe structure 320. The resulting premolded substrate 363 has first and second opposing surfaces 363(*a*), 363(*b*), which coincide with the exterior surfaces of the molding material 322 and the first and second surfaces 320(*a*), 320(*b*) of the leadframe structure 320. Unlike the substrate shown in FIG. 7B, no concave structure is formed in the premolded substrate 363 that is shown in FIG. 8B.

Figure 8C:
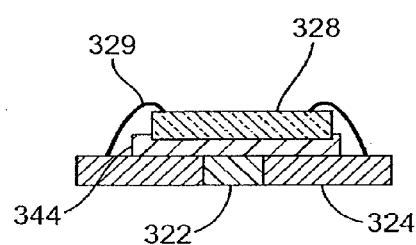

As shown in FIG. 8C, a semiconductor die 328 is mounted on the substrate 363 using an adhesive 344 after the substrate 363 is formed. In this example, the semiconductor die 328 may comprise an upper surface with electrical terminals, where the electrical terminals form part of a horizontal device in the semiconductor die 328. The adhesive 344 may be an epoxy adhesive or any other suitable type of adhesive, and may be filled or unfilled.

After mounting the semiconductor die 328 to the substrate 363, wirebonds 329 are formed between the leads 324 of the substrate 363 and the upper surface of the semiconductor die 328. As an alternative, conductive clips could be used in other embodiments of the invention.

As shown in FIG. 8D, after the wirebonds 329 are formed between the top surface of the semiconductor die 328 and the leads 324, an encapsulating material 332 is formed over the semiconductor die 328 to form a semiconductor die package 330. This may constitute a second molding process. In this example, the encapsulating material 332 does not extend past the outer edges of the substrate 363. As in prior embodiments, the encapsulating material 332 may be the same or different than the molding material 322.

Figure 8E:
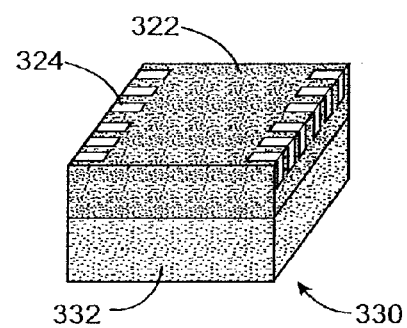
FIG. 8E shows a perspective view of the semiconductor die package formed using the process shown in FIGS. 8A-8D.

FIG. 8E shows a bottom perspective view of the semiconductor die package 330 shown in FIG. 8D. As shown in FIG. 8E, the bottom surface of the semiconductor die package 330 is flat. The bottom surfaces of the leads 324 are substantially coplanar with the bottom surfaces of the molding material 322.

Figure 9A:
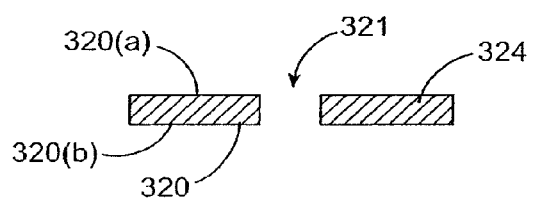
FIGS. 9A-9D show cross-sectional views of another semiconductor die package has it is being formed.

FIG. 9A shows another side, cross-sectional view of a leadframe structure 320 including a gap 321. The leadframe structure 320 also includes a first surface 320(a) and a second surface 320(b), and leads 324 on opposite sides of the gap 321.

Figure 9B:
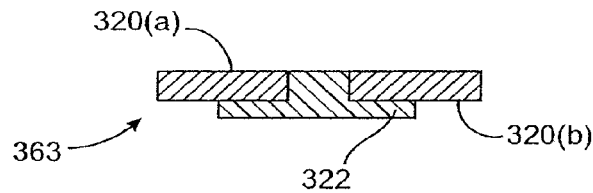

FIG. 9B shows the leadframe structure 320 after a molding process has been performed. As shown, the formed molding material 322 fills the gap 321 and covers part of the second surface 320(b) of the leadframe structure 320 to form a substrate 363. However, the molding material 322 in this example does not cover the first surface 320(a) of the leadframe structure 320.

Figure 9C:
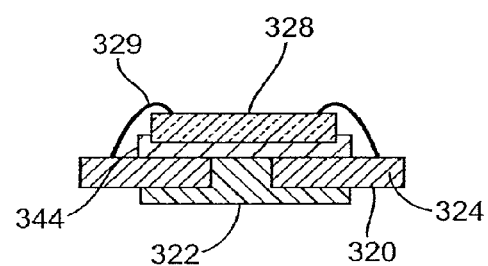

Referring to FIG. 9C, after the substrate 363 is formed, a semiconductor die 328 is attached to the substrate 363 using an adhesive 344. Wirebonds 329 are formed between the upper surface of the semiconductor die 328 and the leads 324 of the leadframe structure 320 in the substrate 363. As in prior embodiments, conductive clips could be used in place of wirebonds 329.

Figure 9D:
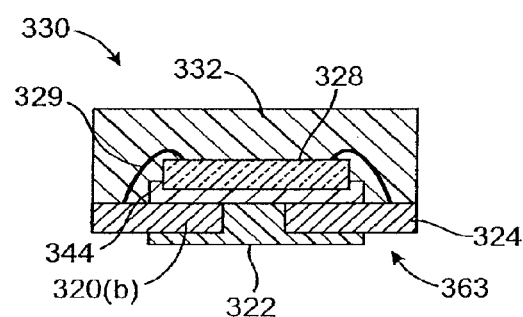

Referring to FIG. 9D, after the semiconductor die 328 is attached to the substrate 363, an encapsulating material 332 is formed over the substrate 363 and the semiconductor die 328 to form a semiconductor die package 330. As shown, the leads 324 of the leadframe structure 320 do not extend past the encapsulating material 332.

Figure 9E:
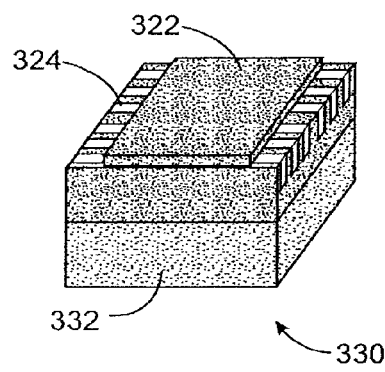
FIG. 9E shows a perspective view of another semiconductor die package according to an embodiment of the invention.

FIG. 9E shows a bottom, perspective view of a semiconductor die package 330 in FIG. 9D. As shown, the molding material 322 protrudes from the second surface 320(b) of the leadframe structure 320.

Figure 10A:
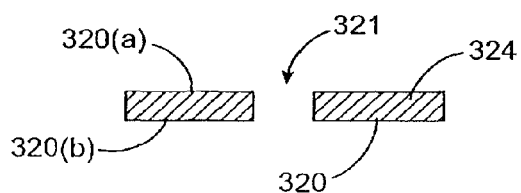
FIGS. 10A-10D show cross-sectional views of another semiconductor die package has it is being formed.

FIG. 10A shows another side, cross-sectional view of a leadframe structure 320 including a gap 321. The leadframe structure 320 also includes a first surface 320(a) and a second surface 320(b), and leads 324 on opposite sides of the gap 321.

Figure 10B:
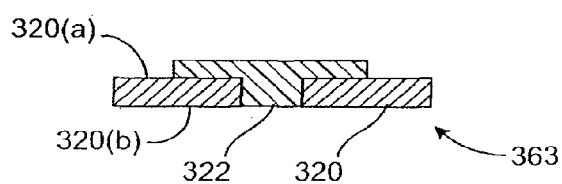

As shown in FIG. 10B, a molding material 322 fills the gap 321 of the leadframe structure 320 and also covers part of the first surface 320(a) of the leadframe structure 320, to form a premolded substrate 363. The molding material 322 does not cover the second surface 320(b) of the leadframe structure 320 in this example.

Figure 10C:
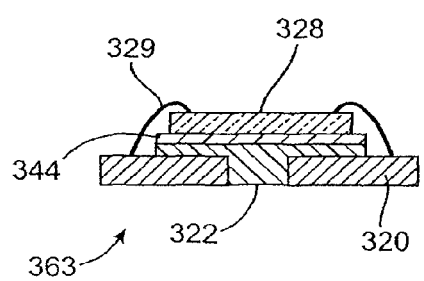

As shown in FIG. 10C, a semiconductor die 328 is mounted on the substrate 363 using an adhesive 344. Wirebonds 329, or the like, may be formed to couple electrical terminals (not shown) at the upper surface of the semiconductor die 328 to the leads 324 of the leadframe structure 320 of the substrate 363.

Figure 10D:
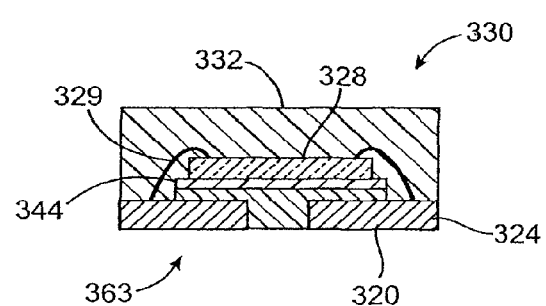

As shown in FIG. 10D, an encapsulating material 332 covers the semiconductor die 328 to the leads of the substrate 363 to form a semiconductor die package 330. As shown, the bottom surface of the semiconductor die package 330 is flat.

Figure 10E:
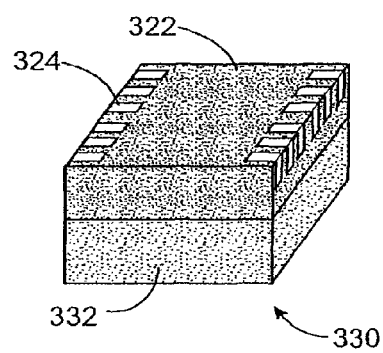
FIG. 10E shows a perspective view of another semiconductor die package according to an embodiment of the invention.

FIG. 10E shows a bottom, perspective view of the semiconductor die package 330 is shown in FIG. 10D.

Figure 11A:
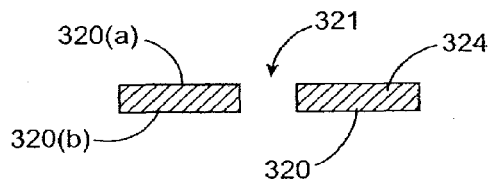
FIGS. 11A-11D show cross-sectional views of another semiconductor die package has it is being formed.

FIG. 11A shows another side, cross-sectional view of a leadframe structure 320 including a gap 321. The leadframe structure 320 also includes a first surface 320(a) and a second surface 320(b), and leads 324 on opposite sides of the gap 321.

Figure 11D:
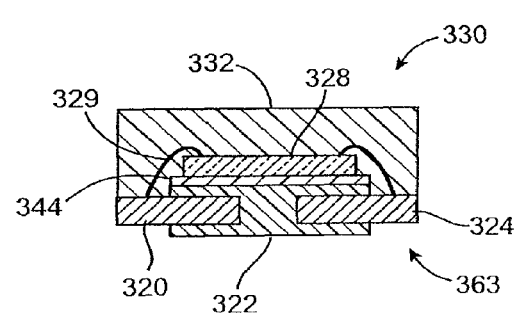
Figure 11B:
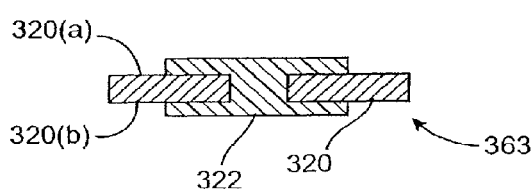

FIG. 11B shows a side, cross-sectional view of a substrate 363 after subjecting the leadframe structure 320 to a molding process. The substrate 363 includes a molding material 322 which fills the gap 321 and covers part of the first and second surfaces 320(a), 320(b) of the leadframe structure 320.

Figure 11E:
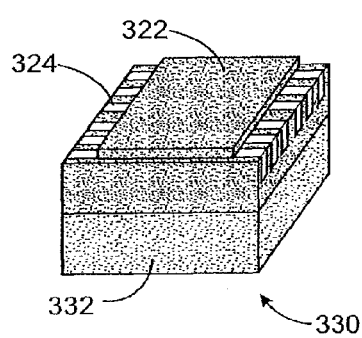
FIG. 11E shows a bottom perspective view of the semiconductor die package.
Figure 11C:
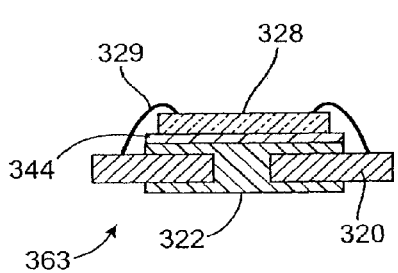

FIG. 11C shows the mounting of a semiconductor die 328 on the substrate 363 using an adhesive 344. Wirebonds 329, or the like, are formed between the upper surface of the semiconductor die 328 and the leads 324 of the substrate 363.

As shown in FIG. 11D, an encapsulating material 332 is then formed over the substrate 363 and the semiconductor die 328 to form a semiconductor die package 330. As shown, the molding material 322 protrudes past the bottom surfaces of the leads 324.

FIG. 11E shows a bottom, perspective view of the semiconductor die package 330 shown in FIG. 11D. As shown, the exterior surface of the molding material 322 that is between the leads 324 and the exterior surfaces of the leads 320 are substantially coplanar. However, the central portion of the molding material 322 between the opposite sets of leads 324 is raised with respect to the exterior surfaces of the leads 320.

Figure 12A:
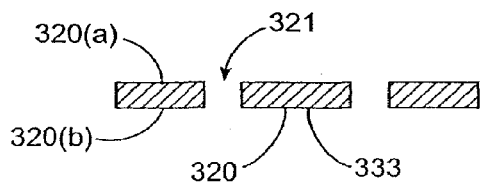
FIG. 12A-12D show cross-sectional views of another semiconductor die package has it is being formed.

FIG. 12A shows another side, cross-sectional view of a leadframe structure 320 including gaps 321. The leadframe structure 320 also includes a first surface 320(a) and a second surface 320(b). Leads 324 are on opposite sides of the gaps 321. A major central portion 333 is between the gaps 321.

Figure 12D:
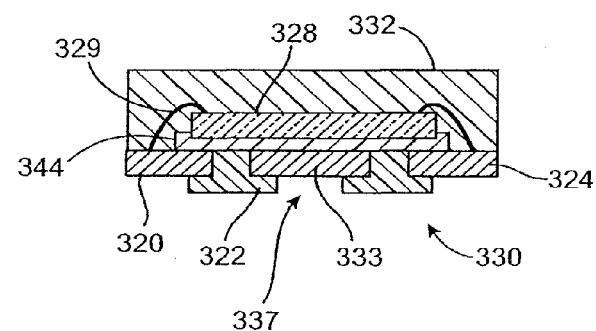
Figure 12B:
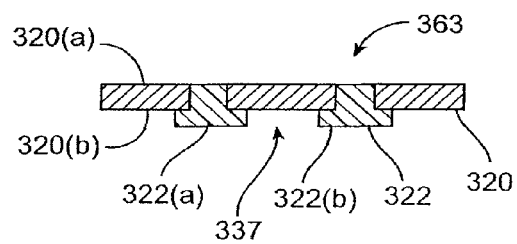

FIG. 12B shows the leadframe structure 320 in FIG. 12A after a molding process is performed. As shown, a molding material 322 is formed within the gaps 321, and on at least a portion of the second surface 320(b) of the leadframe structure 320 to form a premolded substrate 363 according to an embodiment of the invention. The molding material 322 includes a first portion 322(a) and a second portion 322(b). The first portion 322(a), the second portion 322(b), and the major central portion 333 of the leadframe structure 320 between the first and second portions 322(a), 322(b) can form a concave structure 337.

Figure 12E:
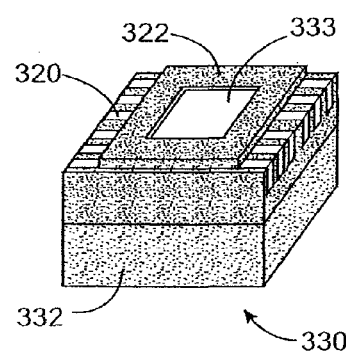
FIG. 12E shows a bottom perspective view of the semiconductor die package shown in FIG. 12D.
Figure 12C:
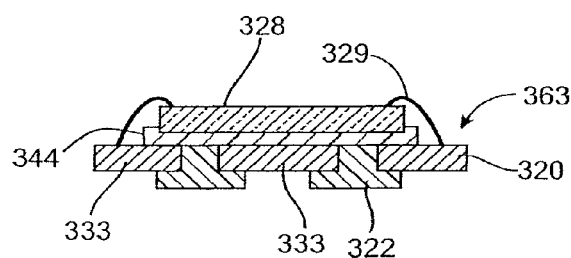

As shown in FIG. 12C, a semiconductor die 328 is mounted on the substrate 363 using an adhesive 344. The surface of the substrate 363 upon which the semiconductor die 328 is mounted is flat. Then, wirebonds 329 (or the like) are formed between the leads 324 of the substrate 363 and any electrical terminals at the upper surface of the semiconductor die 328.

As shown in FIG. 12D, after the semiconductor die 328 is mounted on the substrate 363, an encapsulating material 332 is formed on the substrate 363 and over the semiconductor die 328 to form a semiconductor die package 330.

FIG. 12E shows a bottom, perspective view of the semiconductor die package 330 shown in FIG. 12D. As shown in FIG. 12E, the molding material 322 includes a rim of molding material 322 that surrounds and forms a concave structure with the major portion 333 of the leadframe structure 320.

The embodiments described with respect to FIGS. 6-12 have wirebonds or the like to connect electrical terminals at a surface of a semiconductor die, opposite to the premolded substrate mounting surface, to leads in the premolded substrate. FIGS. 13-17 illustrate that embodiments of the invention may be used with a flip chip type die to form a flip chip type semiconductor die package.

Figure 13A:
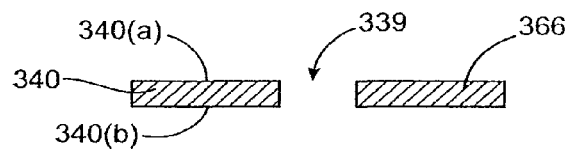
FIG. 13A-13D show cross-sectional views of another semiconductor die package has it is being formed.

FIG. 13A shows another side, cross-sectional view of a leadframe structure 340 including a gap 339. The leadframe structure 340 also includes a first surface 340(a) and a second surface 340(b). Leads 366 are on opposite sides of the gap 339.

Figure 13B:
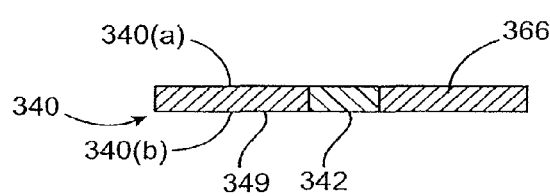

FIG. 13B shows the leadframe structure 340 in FIG. 13A after it has been subjected to a molding process to form a premolded substrate 349. As shown therein, the molding material 342 fills the gap 339, but does not extend past the first and second surfaces 340(a), 340(b) of the leadframe structure 340. The resulting premolded substrate 349 has opposing planar surfaces.

Figure 13C:
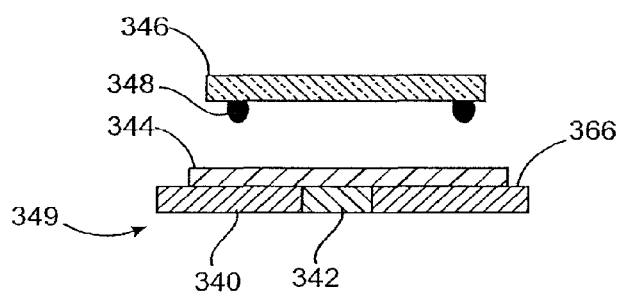

FIG. 13C shows a semiconductor die 346 including a number of solder bumps 348. The solder bumps 348 may be coupled to electrical terminals in a semiconductor device in the semiconductor die 346.

The solder bumps 348 may comprise any suitable solder material including Pb—Sn solder, Pb-free solder, etc. As an alternative, conductive columns comprising a conductive material such as copper may be used in place of or in addition to the solder bumps 348.

As shown in FIG. 13C, the semiconductor die 346 is mounted on the premolded substrate 349 using an adhesive 344. The adhesive 346 may be deposited on the substrate 349 using any suitable process including laminating, roller coating, doctor blade coating, etc. Any suitable adhesive including an epoxy adhesive may be used.

Figure 13D:
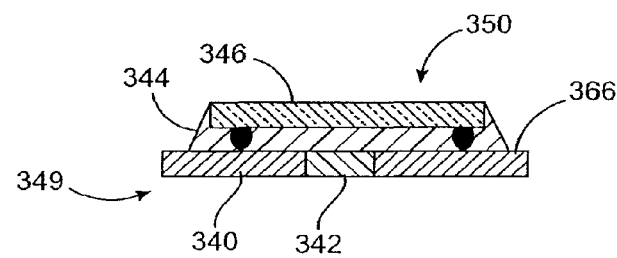

FIG. 13D shows the formed semiconductor die package 350 after the semiconductor die 346 is mounted to the substrate 349. As shown, the adhesive 344 fills the space between the semiconductor die 346 and the premolded substrate 349, and may lie partially outside the periphery of the semiconductor die 346. In the semiconductor die package 350, the solder bumps 348 electrically couple terminals (not shown) in the semiconductor die 346 to the leads 366 of the leadframe structure 340.

Although FIGS. 13C and 13D show an adhesive being deposited on a substrate first and then mounting a semiconductor die 346 on the substrate 349, it is understood that other embodiments are possible. For example, it is possible to first mount the semiconductor die 346 to the substrate 349, and then fill the space between the semiconductor die 346 and the substrate 349 with an underfill material. Underfill materials are commercially available. In other embodiments, an underfill material or an additional adhesive may not be needed, since the solder 348 couples the semiconductor die 346 to the premolded substrate 349.

Figure 13E:
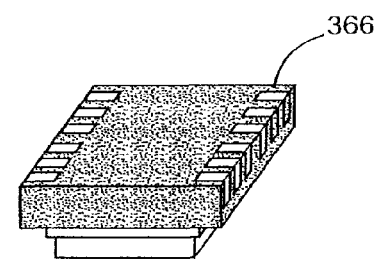
FIG. 13E shows a bottom perspective view of the semiconductor die package shown in FIG. 13D.

FIG. 13E shows a bottom, perspective view of the semiconductor die package 350 shown in FIG. 13D. As shown, the bottom surface of the semiconductor die package 350 coincides with the second surface 340(b) of the leadframe structure 340. At the bottom of the semiconductor die package 350, the exterior surface of the leadframe structure 340 is substantially coplanar with the exterior surface of the molding material 342.

FIG. 14A shows another side, cross-sectional view of a leadframe structure 340 including a gap 339. The leadframe structure 340 also includes a first surface 340(a) and a second surface 340(b). Leads 366 are on opposite sides of the gap 339.

FIG. 14B shows the leadframe structure 340 after it has been subjected to a molding process. The molding material 342 fills the gap 339 and covers at least a portion of the second surface 340(b) of the leadframe structure 340 to form a premolded substrate 349. The first surface 340(a) is not covered by the molding material 342 in this embodiment.

FIG. 14C shows a semiconductor die 346 including solder bumps 348 being mounted on the substrate 349 with an adhesive 344. As in the prior embodiment, the solder bumps 348 penetrate the adhesive layer 344 to contact the leadframe structure 340. As in the prior embodiments, the solder bumps 348 can comprise any suitable solder including Pb—Sn, Pb-free solder, etc. Conductive columns could be used in addition to or in place of solder.

FIG. 14D shows the semiconductor die package 350 after the semiconductor die 346 is mounted on the substrate 349. FIG. 14E shows a bottom, perspective view of the semiconductor die package 350 shown in FIG. 14D. As shown in FIGS. 14D and 14E, the molding material 342 protrudes downward from the second surface 340(b) of the leadframe structure 340. As shown in FIG. 14E, the molding material 342 that is between adjacent leads 366 is substantially coplanar with the exterior surfaces of the leads 366.

Figure 15A:
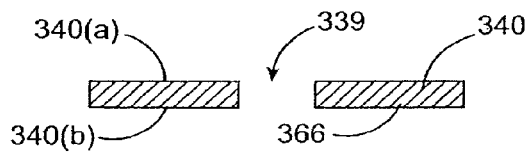
FIG. 15A-15D show cross-sectional views of another semiconductor die package has it is being formed.

FIG. 15A shows another side, cross-sectional view of a leadframe structure 340 including a gap 339. The leadframe structure 340 also includes a first surface 340(a) and a second surface 340(b). Leads 366 are on opposite sides of the gap 339.

Figure 15D:
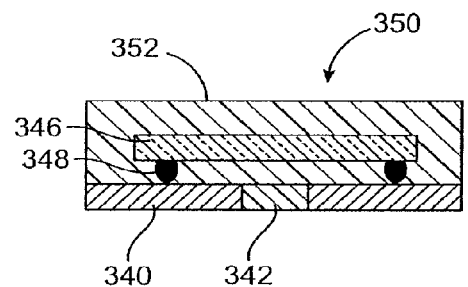
Figure 15B:
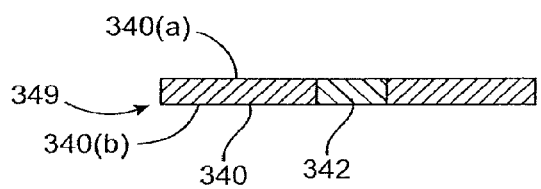

FIG. 15B shows the leadframe structure 340 after it has been subjected to a molding process. The molding material 342 fills the gap 339 and does not cover the first surface 340(a) or the second surface 340(b) of the leadframe structure 340.

Figure 15E:
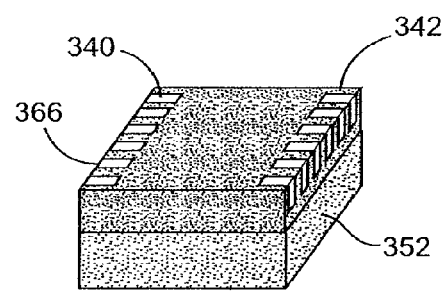
FIG. 15E shows a bottom perspective view of the semiconductor die package shown in FIG. 15D.
Figure 15C:
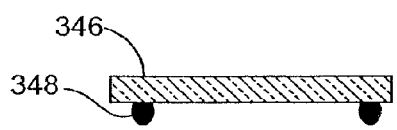
Figure 15C:
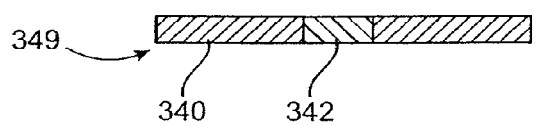

FIG. 15C shows the semiconductor die 346 as it is being mounted on the substrate 349. Like the prior embodiments, the semiconductor die 346 has a number of solder bumps 348 attached to terminals (not shown) in the semiconductor die 346.

As shown in FIG. 15D, after the semiconductor die 346 is mounted to the premolded substrate 349, an encapsulating material 352 may be formed over and under the semiconductor die 346 to form a semiconductor die package 350. The encapsulating material 352 may use the same or different type of material than the previously described molding material 342.

FIG. 15E shows a bottom, perspective view of the semiconductor die package 350. As shown, the exterior surface of the molding material 342 is substantially coplanar with the bottom, exterior surfaces of the leads 366.

The semiconductor die package 350 can be flipped over and mounted to a circuit board. If desired, solder may be formed on the exposed surfaces of the leads 366 prior to mounting the semiconductor die package 350 on the circuit board.

Unlike the prior embodiments, an adhesive layer is not present on the substrate 349 prior to mounting the semiconductor die 346 on the substrate 349. Instead, the encapsulating material 350 covers both the top and bottom surfaces of the semiconductor die 346.

Figure 16A:
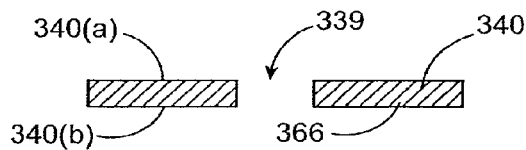
FIG. 16A-16D show cross-sectional views of another semiconductor die package has it is being formed.

FIG. 16A shows another side, cross-sectional view of a leadframe structure 340 including a gap 339. The leadframe structure 340 also includes a first surface 340(a) and a second surface 340(b). Leads 366 are on opposite sides of the gap 339.

Figure 16D:
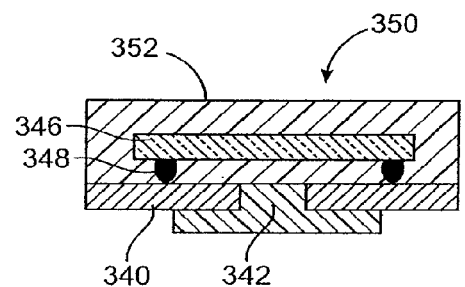
Figure 16B:
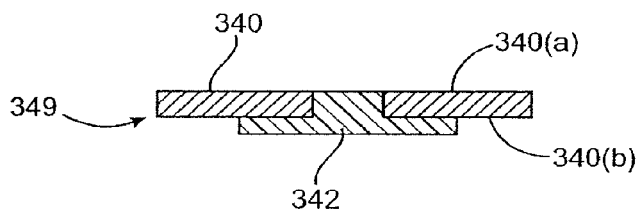

FIG. 16B shows the leadframe structure 340 after it has been subjected to a molding process. The molding material 342 fills the gap 339 and covers at least a portion of the second side 340(b) to form a premolded substrate 349.

Figure 16E:
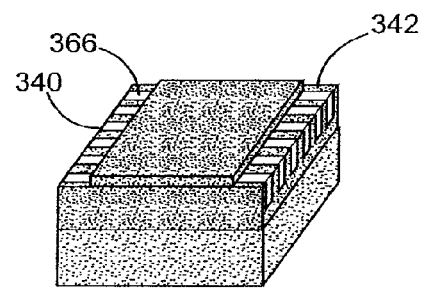
FIG. 16E shows a bottom perspective view of the semiconductor die package shown in FIG. 16D.
Figure 16C:
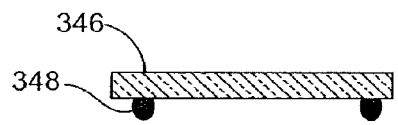
Figure 16C:
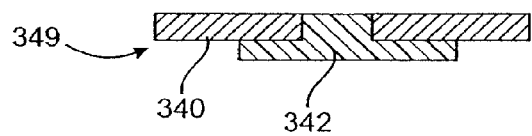

FIG. 16C shows the semiconductor die 346 as it is being mounted on the premolded substrate 349. The semiconductor die 346 includes a plurality of solder bumps 348. The solder bumps 348 contact the leads 366 after mounting.

As shown in FIG. 16D, after the semiconductor die 346 is mounted to the substrate 349, an encapsulating material 352 may be formed over and under the semiconductor die 346 to form a semiconductor die package 350.

FIG. 16E shows a bottom, perspective view of the semiconductor die package 350 shown in FIG. 16D. As shown, the molding material 342 that is between adjacent leads 366 is substantially coplanar with exterior surfaces of those leads 366. A larger portion of the molding material 342 protrudes from the leads 366.

Figure 17A:
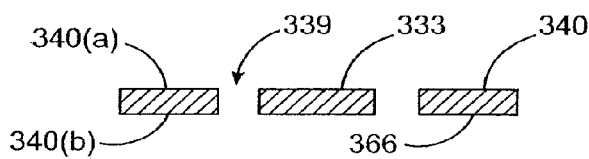
FIG. 17A-17D show cross-sectional views of another semiconductor die package as it is being formed.

FIG. 17A shows another side, cross-sectional view of a leadframe structure 340 including at least two gaps 339. The leadframe structure 340 also includes a first surface 340(a) and a second surface 340(b). A major central portion 333 is between the gaps 339. Leads 366 extend outwardly from the gaps 339.

Figure 17D:
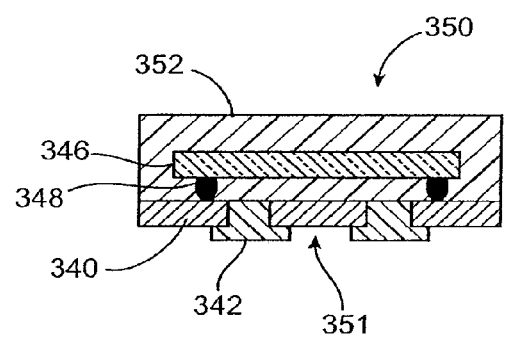
Figure 17B:
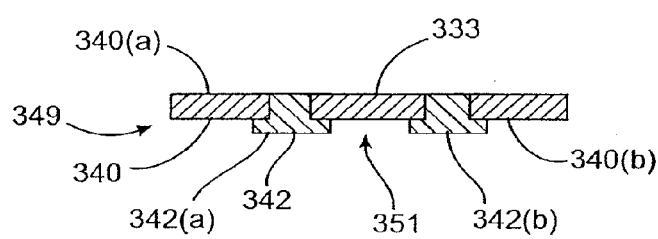

FIG. 17B shows the leadframe structure 340 after it has been subjected to a molding process. As shown in FIG. 17B, the molding material 342 fills the gaps 339 and covers at least a portion of the second surface 340(b) to form a premolded substrate 349. The molding material 342 includes a first portion 342(a) and a second portion 342(b), which along with a second of the major central portion 333 of the leadframe structure 340 forms a concave structure 351.

Figure 17E:
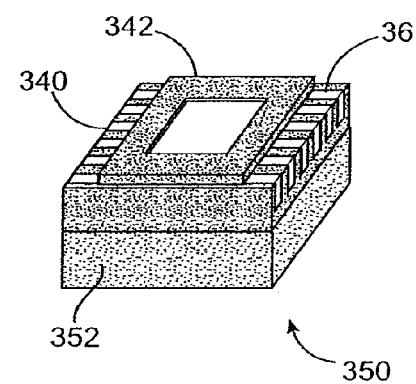
FIG. 17E shows a bottom perspective view of the semiconductor die package shown in FIG. 17D.
Figure 17C:
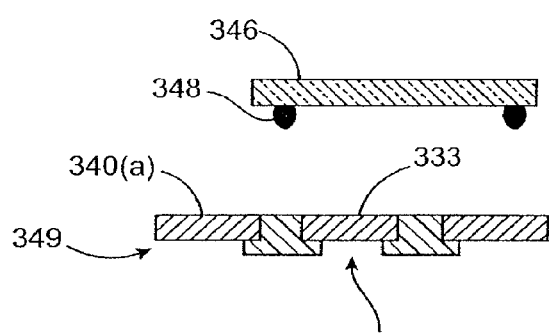

FIG. 17C shows the semiconductor die 346 as it is being mounted on the substrate 349. The semiconductor die 346 includes a number of solder structures 348 attached to its underside. The solder structures 348 electrically couple electrical terminals in the semiconductor die 348 to the leads 366 of the leadframe structure 340.

As shown in FIG. 17D, after the semiconductor die 346 is mounted to the substrate 349, an encapsulating material 352 may be formed over and under the semiconductor die 346 to form a semiconductor die package 350.

FIG. 17E shows a bottom, perspective view of the semiconductor die package 350 shown in FIG. 17D. As shown in FIG. 17E, a rim of molding material 342 is formed around the major central portion 333. Together, they can form a concave structure.

The embodiments described with reference to FIGS. 5-17 provide for a number of advantages. First, the semiconductor die packages can be produced less expensively, since expensive cover tape and etched leadframe structures are not needed to create a semiconductor die package. In these embodiments, an etched leadframe structure and cover tape are not needed to form a premolded substrate, since a molding tool with molding dies is used to form the premolded substrate. In some instances, this can reduce the cost of a semiconductor die package by 42% when compared to semiconductor die packages that are produced using expensive cover tape. Second, as shown by many of the foregoing embodiments, the semiconductor die packages can use larger semiconductor dice. As illustrated above, the size of the semiconductor dice need not be constrained to the size of the die attach pads in the leadframe structures that are used in the substrates. Third, in embodiments of the invention, it is possible to increase the pin lead count, without increasing the size of the semiconductor die package. Fourth, when a concave structure is formed, it is possible to increase solder joint reliability. The concave structures can contain solder that is used to attach the formed semiconductor die packages to printed circuit boards or the like.

IV. Design and Method of Manufacture of a High Power Module

High power modules are used in a number of electronics applications. Some high power modules are "smart" power modules. These power modules include at least one power semiconductor die and at least one control semiconductor die. The control semiconductor die (e.g., a driver integrated circuit or driver chip) may be used to at least partially control the operation of the power semiconductor die.

Additional embodiments of the invention are directed to high power modules and methods for making high power modules. In one embodiment, a substrate including a leadframe structure and a molding material is obtained. A surface of the molding material and the leadframe structure are substantially coplanar. The substrate includes a first die attach region and a second die attach region. A first semiconductor die is attached to the first die attach region, and a second semiconductor die is attached to the second die attach region. The first semiconductor die may comprise a power transistor. The second semiconductor die may comprise be a control chip (or driver IC or driver integrated circuit). Additional power transistors and additional electronic components may also be present in the high power module.

Figures 1, 18A:
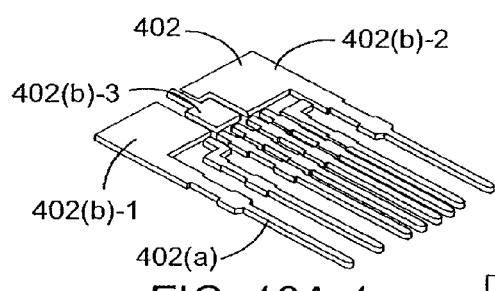
FIG. 18A-1 is a bottom perspective view of a leadframe structure.

FIG. 18A-1 shows a leadframe structure 402 including a first die attach region 402(b)-1, a second die attach region 402(b)-2, and a third die attach region 402(b)-3. The spaces between the various die attach regions 402(b)-1, 402(b)-2, 402(b)-3 may be defined by the voltage requirements of the package to be formed.

The leadframe structure 402 also includes a number of leads 402(a) extending away from the first, second, and third die attach regions 402(b)-1, 402(b)-2, 402(b)-3. In this example, the leads 402(a) extend away from the first, second, and third die attach regions 402(b)-1, 402(b)-2, 402(b)-3 in a single direction. In other examples, they may extend away from the various die attach regions in more than one direction. In this example, the third die attach region 402(b)-3 may correspond to a die paddle for a driver semiconductor die while the other die attach regions 402(b)-1, 402(b)-2 may correspond to die paddles for power semiconductor dice.

Figures 2, 18A:
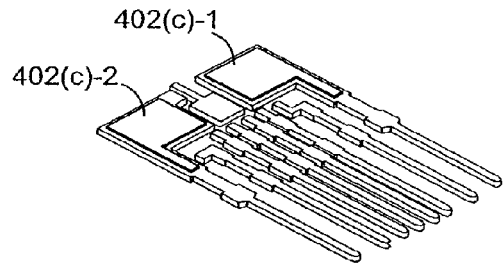

FIG. 18A-2 shows the reverse side of the leadframe structure 402. The leadframe structure 402 includes a first half-etched region 402(c)-1 and a second half-etched region 402(c)-2. In embodiments of the invention, the etched regions may be formed by partially etching through the thickness of a leadframe structure. A "half-etched" structure may refer to a portion of a leadframe structure that has been formed after about half of the thickness of the leadframe structure is removed.

The half-etched regions 402(c)-1, 402(c)-2 may be formed using a standard etching process. For example, the surfaces corresponding to the half-etched regions 402(c)-1, 402(c)-2, prior to etching, may be covered with a material such as a photoresist or tape (e.g., polyimide tape). Then, an etching material (e.g., a liquid etchant or dry etchant) may be used to etch the regions of the leadframe structure 402 not covered by the covering material. Referring to both FIGS. 18A-1 and 18A-2, in this example, the first half-etched region 402(c)-1 and the first die attach region 402(b)-1 may be part of the same structure. Also, in this example, the second half-etched region 402(c)-2 and the second die attach region 402(b)-2 may also be part of the same structure.

Figures 1, 18B:
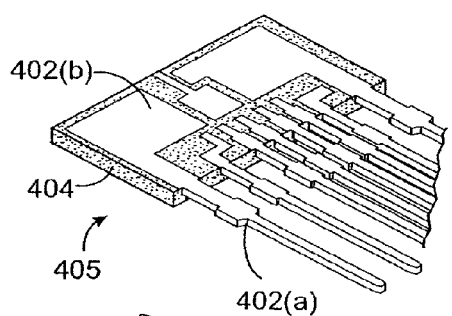
Figures 2, 18B:
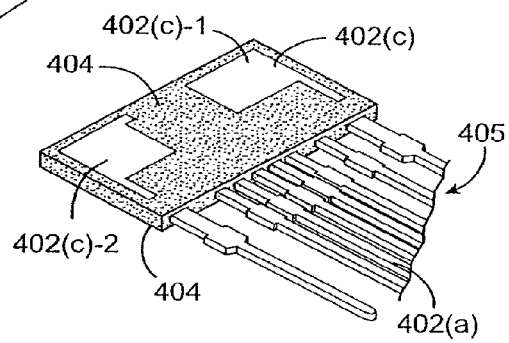

FIG. 18B-1 shows the leadframe structure 402 after a molding process is performed. After a molding process (e.g., a transfer molding process) is performed, a molding material 404 is formed around the leadframe structure 402, thereby forming a premolded substrate 405. In one exemplary transfer molding process, surfaces of the leadframe structure 402 that are not intended to be covered by a molding material may be covered with tape (e.g., polyimide tape) to prevent mold bleeding during molding. After the leadframe structure 402 is covered with tape, a molding material may be deposited on the leadframe structure 402. The tape is subsequently removed thus exposing the previously covered portions of the leadframe structure 402 through the molded molding material. In other embodiments, as noted above, premolded substrates can be formed using mold tools without using cover tape.

As shown, the molding material 404 is formed so that exterior surfaces of the molding material 404 are substantially coplanar with the exterior surfaces of the first, second, and third conductive die attach regions 402(b)-1, 402(b)-2, 402(b)-3. As shown in FIG. 18B-1, leads 402(a) extend away from one lateral edge of the molding material 404. In other embodiments, the leads extending from the conductive die attach regions 402(b)-1, 402(b)-2, 402(b)-3 may extend away from two or more lateral edges of the molding material 404.

FIG. 18B-2 shows a bottom, perspective view of the premolded substrate 405. As shown, the exterior surfaces of the first and second half-etched regions 402(c)-1, 402(c)-2 are exposed through the molding material 404.

The premolded integrated leadframe structure according to embodiments of the invention have lower warpage and higher rigidity as compared to some conventional substrates. As will be apparent from the description below, in embodiments of the invention like SIP (system in a package) modules, there is no need for an extra heat sink or a substrate like a direct bonded copper or insulated metal substrate. The thermal performance of the semiconductor die package can be achieved by using leadframe structures with appropriate thicknesses. The electrical circuitry of the premolded substrate can be defined during the molding operation.

Figure 18C:
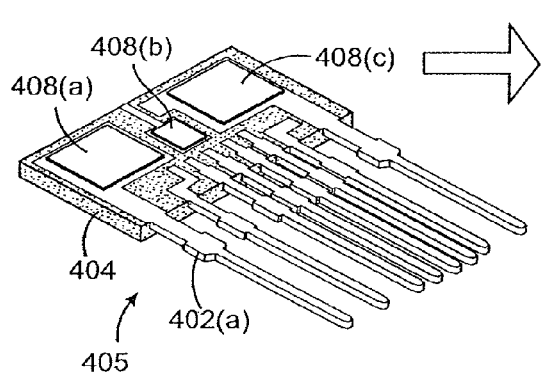
FIG. 18C is a top perspective view of a premolded substrate with semiconductor dice mounted thereon.

As shown in FIG. 18C, first, second, and third semiconductor dice 408(a), 408(b), 408(c) are attached to the substrate 405 using an adhesive or some other suitable material. As in prior embodiments, an epoxy type adhesive, or any other suitable commercially available adhesive may be used to attach the semiconductor dice 408(a), 408(b), 408(c) to the premolded substrate 405.

As in the previously described embodiments, wirebonds (not shown) may also be formed between the leads 402(a) and the terminals at the upper surfaces of the semiconductor dice 408(a), 408(b), 408(c) if desired. Wirebonds may also be used to connect the different semiconductor dice to each other. For example, the semiconductor die 408(b) may be a driver IC die while the semiconductor dice 408(a), 408(c) may be power IC dice. The driver IC die may be electrically coupled to and may control the power IC dice via wires. In other embodiments, other conductive structures such as conductive clips can be used instead of wirebonds.

Figure 18D:
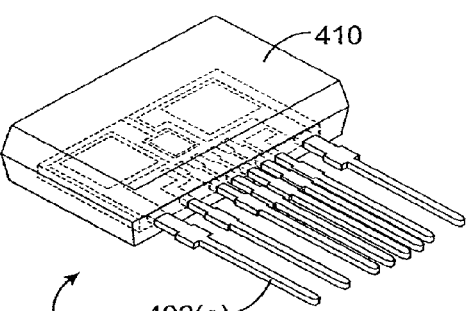
FIG. 18D is a top perspective view of a semiconductor die package including a premolded substrate.

As shown in FIG. 18D, an encapsulating material 410 is formed over the first, second, and third semiconductor dice 408(a), 408(b), 408(c) to form a semiconductor die package 400. The encapsulating material 410 may be formed using a standard molding process. In the exemplary semiconductor die package 400, leads 402(a) extend away from only one side of the encapsulating material 410.

After performing the encapsulation process, the formed package can be trimmed and formed to appropriate dimensions.

Figure 19B:
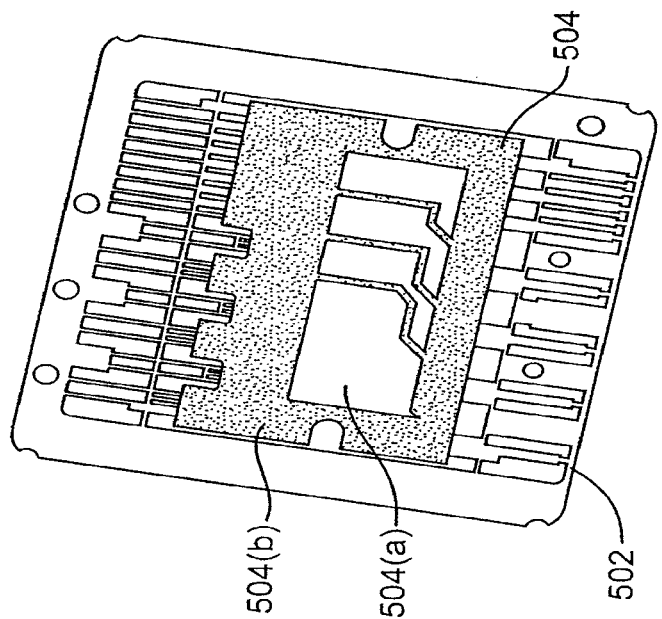
FIG. 19B shows a bottom perspective view of the premolded leadframe substrate in FIG. 18A.
Figure 19A:
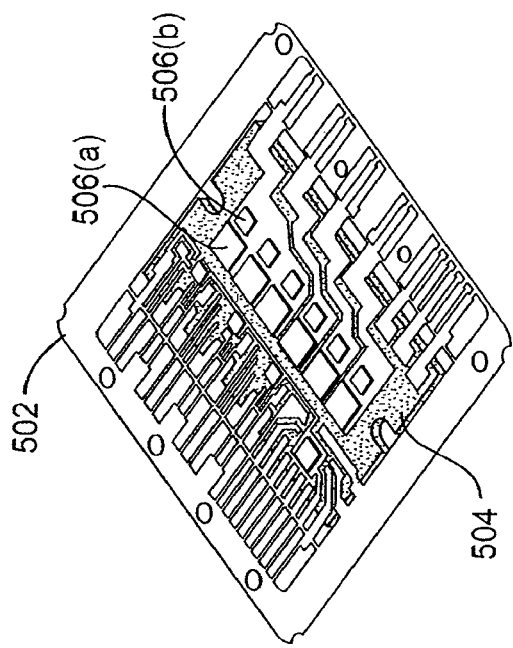
FIG. 19A is a top perspective view of a premolded leadframe substrate including semiconductor dice mounted thereon.

FIGS. 19A and 19B show views of an SPM (smart power module) type package that can be made using the same general process flow that is described with respect to FIGS. 18A-D.

FIG. 19A shows a perspective view of a frame structure 502 that serves as a frame for a substrate 504 including a leadframe structure. FIG. 19B shows a bottom view of the frame structure 502 and the substrate 504. First and second semiconductor dice 506(a), 506(b) are on the substrate 504. As described previously, the substrate 504 is formed using a leadframe structure 504(a) and a molding material 504(b). As in the prior embodiments, portions of the leadframe structure 504(a) may be partially etched and the molding material 504(a) have exterior surfaces that are substantially coplanar with the exterior surfaces of the molding material 504(a).

As described above, embodiments of the invention can have half or partially etched leadframe structures having predefined die paddles for power and driver IC semiconductor dice. The isolation spacing between the die attach paddles can be controlled by the voltage requirements of the semiconductor die packages. In addition, the leadframe structures may be pre-molded and the leadframe structures may be backcoated with tape to prevent mold bleeding during molding. Also, the exterior surface of the molding material may be substantially coplanar with the exterior surfaces of the die attach paddles in the premolded substrate As noted above, the pre-molded integrated leadframe substrate has a lower warpage and higher overall panel rigidity than other substrates. In addition, there is no need for an extra heat sink or substrate like a direct bonded copper or insulated metal substrate since the thermal performance of the package can be achieved using leadframe structures with different thicknesses. Thicker leadframe structures can be used if better heat transfer is desired. In embodiments of the invention, a sub-assembly panel can be molded to a final package dimension and the final package can then be trimmed and formed.

The semiconductor die packages that are described above can be high thermal efficiency packages and can be used in packages such as LCD (liquid crystal display) TV module packages.

V. Substrates for High Power Modules

Other embodiments of the invention are directed to premolded substrates for semiconductor die packages, methods for making the premolded substrates, and semiconductor die packages including the premolded substrates.

In one embodiment, a first leadframe structure and a second leadframe structure are obtained. Then, the first and second leadframe structures are attached together using an adhesion layer. Then, a molding material is applied to the first leadframe structure, the second leadframe structure, or the adhesion layer.

FIG. 20A shows a top plan view of a substrate 700 according to an embodiment of the invention. FIG. 20B shows a top perspective view of the substrate 700 shown in FIG. 20A. In this example, the top surface of the substrate 700 includes four conductive regions 752, which are separated and bordered by insulating regions 754. The insulating regions 754 comprise a molding material which fills gaps 758 between the conductive regions 752. The conductive regions 752 may serve as conductive die attach regions. The four conductive regions 752 may part of a single leadframe structure. When the gaps between the four conductive regions 752 are filled with a molding material, the molding material has exterior surface substantially coplanar with the exterior surfaces of the conductive regions 752. This combination can form a premolded substrate as described above.

FIG. 20C shows a side, cross-sectional view of the substrate 700 shown in FIGS. 20A, 20B. As shown in FIG. 20C, the substrate 700 includes two, half-etched leadframe structures 702 facing each other. The two, half-etched leadframe structures 702 may comprise copper, a copper alloy, or any other suitable conductive material. The two, half-etched (or partially etched) leadframe structure 702 can be formed from two 10-20 mil thick leadframe structures, that have each been partially etched to a thickness of about 5-10 mils at certain locations. In other embodiments, the leadframe structures 702 can have thicknesses of about 20-40 mils and can be half-etched to thicknesses of about 10-20 mils at certain locations. The leadframe structures 702 preferably have the same thicknesses and configurations. However, this is not necessary in all instances.

Each leadframe structure 702 may be present in a premolded substrate. The premolded substrates and their corresponding leadframe structures 702 are laminated to and contact an adhesive layer 704, which is disposed between the leadframe structures 702. After lamination, a sandwich composite is formed.

The adhesive layer 704 may have any suitable form and may have any suitable thickness. For example, the thickness of the adhesive layer 704 may be about 1-3 mils in some embodiments. Also, the adhesive layer 704 may be in the form of a continuous or a discontinuous layer.

The adhesive layer 704 may comprise any suitable material which can bond the previously described premolded substrates and leadframe structure 702 together. For example, the adhesive layer 704 may comprise a polymeric layer such as a polyimide layer (polyimide tape). In other embodiments, it is possible to use an FR4 laminate or high K adhesive film to reduce any CTE (coefficient of thermal expansion) mismatch between the adhesive layer 702 and the leadframe structures 702, and any interface shear stress if the formed premolded substrate is particularly large.

The leadframe substrate 702 and adhesive layer laminate that is formed may be symmetrical to reduce potential warpage issues. For example, as shown in FIG. 20C, the regions 702(a) formed by the previously described partial etching process can face inwardly toward each other in the formed substrate 700. The two leadframe substrates 702 may also have symmetrical etched patterns and similar geometries so that they are symmetrically disposed in the substrate 700.

The sandwich laminate is further pre-molded with a molding material 706 that is formed around the edges of the leadframe structures 702. The molding material 706 may comprise an epoxy molding material or any other suitable type of molding material. A transfer molding process or other process can be used to form the molding material 706 around the edges of the leadframe structures 702 and the corresponding premolded substrates. For instance, the sandwich laminate may be disposed between two molding dies and the molding material may be molded as shown using well known molding processes. The molding material 706 reduces free edge stress at the interfaces of the formed laminate.

After overmolding the sandwich laminate with the molding material 706, the surfaces of the conductive regions 752 may be further processed if desired. For example, if the exposed conductive regions 752 at the top of the substrate 724 are to be used as conductive die attach regions for power IC semiconductor dice, then the exposed surfaces of the conductive regions 752 may be plated or otherwise coated with an underbump composite such as Ni/Pd/Au, or other metallic layers. Such additional layers may form a solderable pad for soldering semiconductor dice to the conductive regions 752. In another example, if the exposed surfaces of the conductive regions 752 are supposed to be insulated, then the exposed top surfaces of the conductive regions 752 may be anodized. Any suitable known anodization process may be used.

FIG. 20D is a bottom perspective view of the substrate 700 described in the previous Figures.

The substrates 700 and 710 can be manufactured in a panel form as in MLP type packages, and then singulated using, for example, a wafer saw, and then used in subsequent assemblies. As will be described in further detail below, such embodiments can be constructed using common leadframe structures for flexible module assembly. SIP (single in line packages) can also be formed using such embodiments.

Other embodiments are possible. In the previously described embodiments in FIGS. 20A-20D, leadframe structures are partially etched and them molding processes are performed to form premolded substrates. The premolded substrates have leadframe structures with exterior surfaces that are substantially coplanar with the exterior surfaces of the molding material. The premolded substrates are then laminated together with an adhesive layer to form a sandwich composite. The resulting sandwich composite is then edge molded to form a substrate.

However, in other embodiments, it is possible to obtain two partially etched leadframe structures and then laminate them together with an adhesive layer, without first forming premolded substrates. Then, the laminated leadframe structures can then be molded with a molding material to form a substrate that has the same general configuration as previously described.

Although the use of two partially etched leadframe structures have been described in detail, it is understood that two or more etched leadframe structures can be combined to form a combination substrate according to an embodiment of the invention.

FIGS. 20E-20H illustrate other substrates according to other embodiments of the invention.

Figure 20G:
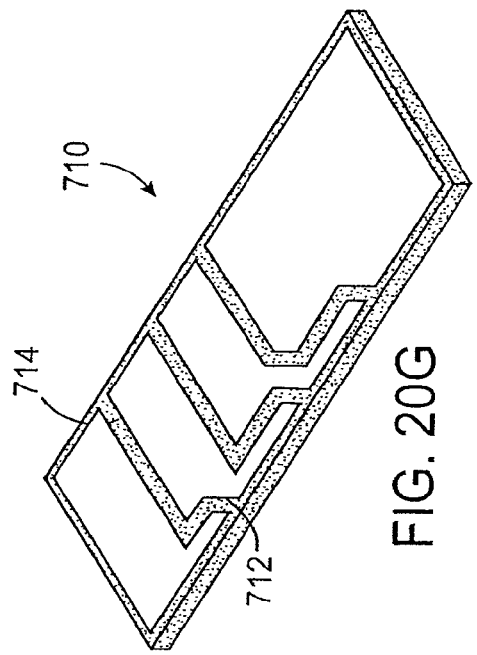
FIG. 20G is a top perspective view of a premolded substrate according to an embodiment of the invention.
Figure 20H:
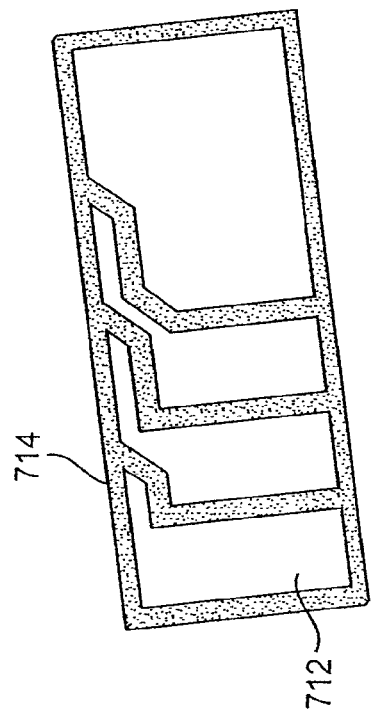
FIG. 20H is a bottom perspective view of a premolded substrate according to an embodiment of the invention.
Figure 20E:
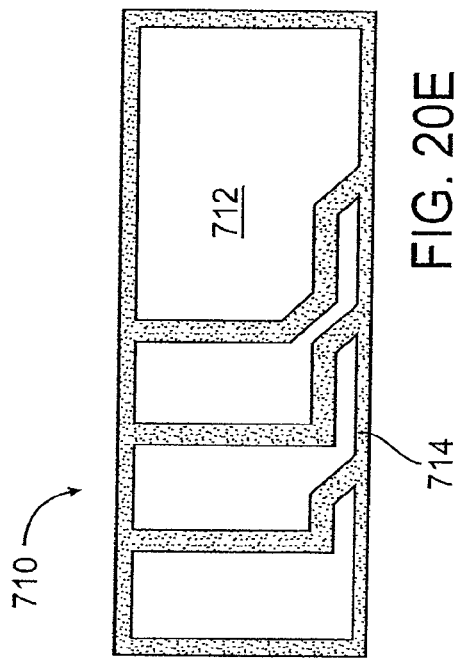
FIG. 20E is a top plan view of a premolded substrate according to an embodiment of the invention.

FIG. 20E shows a top plan view of a substrate 710 according to an embodiment of the invention. The substrate 710 includes a leadframe structure 712 (e.g., a copper leadframe structure) and a molding material 714, which fills the interstices of the leadframe structure 712. Thus, a thick copper leadframe structure can be premolded with a molding material such as an epoxy molding material to electrically isolate metal pads in the substrate 712.

Figure 20F:
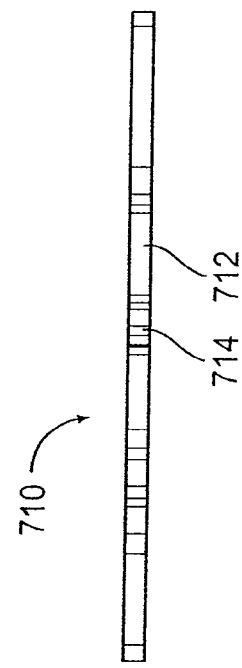
FIG. 20F is a side, cross sectional view of a premolded substrate according to an embodiment of the invention.

FIGS. 20F, 20G, and 20H respectively show side cross-sectional, top perspective, and bottom perspective views of the substrate 710. As shown in FIG. 20F, the thickness of the molding material 714 is substantially equal to the thickness of the leadframe structure 712. The edges of the leadframe structure 712 are also bordered by the molding material 714 so that the molding material forms the outer edge of the substrate 710.

In embodiments of the invention, the previously described substrates 700, 710 can be used independently in semiconductor die packages. As in prior embodiments, semiconductor dice may be mounted to the substrates. If desired, input and output connections can be formed between the mounted semiconductor dice and the substrate and/or external input and/or output sources. The formed packages can then be mounted to a circuit board.

In other embodiments, however, substrates 700, 702 of the type previously described, can be mounted to frame structures to provide the substrates 700, 702 with external leads. These embodiments are shown in FIGS. 21 and 22 and are described in further detail below.

Figure 21A:
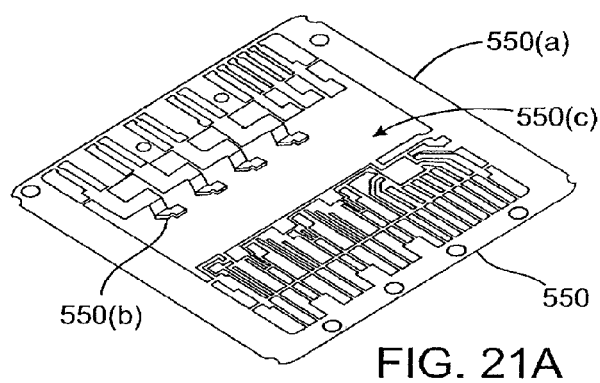
FIG. 21A is a top perspective view of a frame structure.

FIG. 21A shows a frame structure 550 including a frame portion 550(a) and a number of leads 550(b). A central region 550(c) can receive a substrate according to an embodiment of the invention.

Figure 21C:
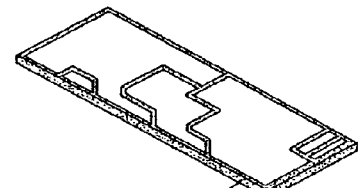
FIGS. 21B and 21C are perspective views of premolded substrates according to embodiments of the invention.
Figure 21B:
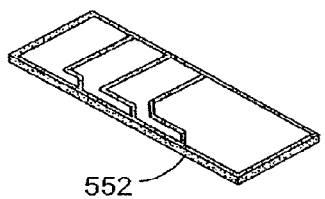

Any suitable substrate may be placed in the central region 550(c). For example, the substrates that can be received in the central region 550(c) may be the substrate 710 shown in FIG. 20E or the substrate 700 shown in FIG. 20C. FIG. 21B shows a top view of a specific substrate 552 that can be placed in the central region 550(c) of the frame structure 550. FIG. 21C shows a bottom perspective view of the substrate 552 shown in FIG. 21B.

Figure 21D:
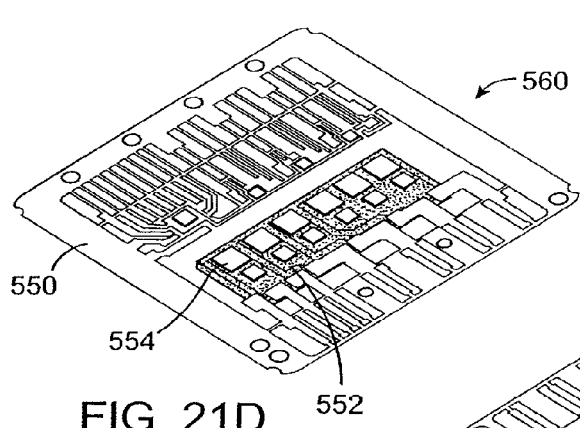
FIGS. 21D and 21E show top perspective views of premolded substrates mounted in frames. Semiconductor dice are mounted on the premolded substrates.
Figure 21E:
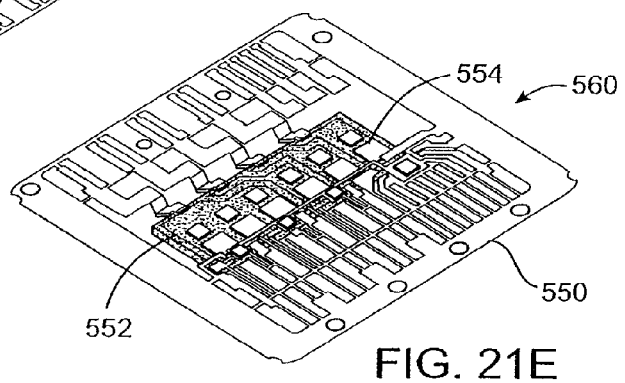

As shown in FIGS. 21D and 21E, a number of semiconductor dice 554 may be mounted to the substrate 552 before or after the substrate 552 is attached to the frame structure 550. As described above, any suitable conductive adhesive may be used to attach the semiconductor dice 554 to the substrate 552. In addition, the semiconductor dice may have any of the characteristics that are described above. For example, at least one of the semiconductor dice 554 may include a driver IC semiconductor die while at least one of the semiconductor dice 554 may include a power IC semiconductor die. After the semiconductor dice 554 are mounted to the substrate 554, a semiconductor die assembly 560 is thereafter formed.

As shown, the substrate 552 including the semiconductor dice 554 may be attached to the leads 550(b) of the frame structure 550. The bottom surfaces of the leads 550(b) may be soldered or otherwise adhered to the top, conductive surfaces of the substrate 552.

In an alternative embodiment, the substrate 552 may be attached to the leads 550(b) of the frame structure 550 without semiconductor dice 554. After the substrate 552 is attached to the leads 550(b) of the frame structure 550, the semiconductor dice 554 may be mounted on the substrate 552.

Figure 21F:
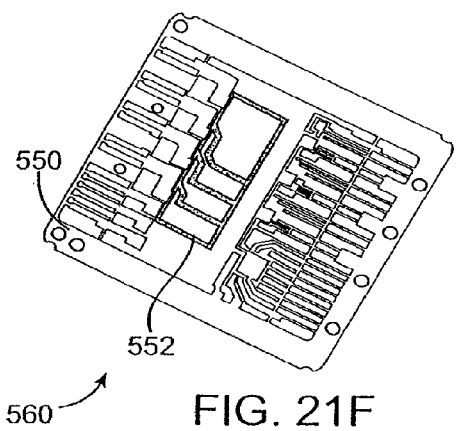
FIG. 21F shows a bottom perspective view of a premolded substrate mounted in a frame.
Figure 21G:
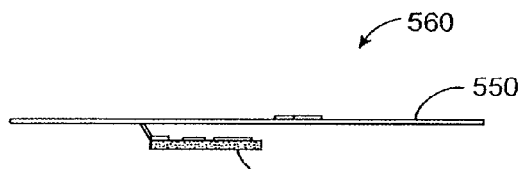
FIG. 21G shows a side view of a premolded substrate mounted to a frame.

FIG. 21F shows a bottom perspective view of the semiconductor die assembly 560. FIG. 21G shows a side, cross-sectional view of a semiconductor die assembly 560.

Figure 22A:
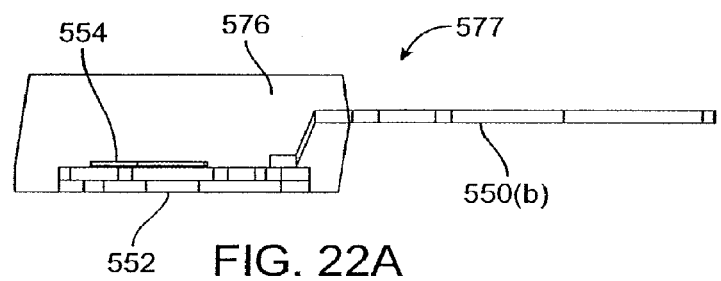
FIGS. 22A-22D respectively show side cross-sectional, rear perspective, top, and front perspective views of a molded die package according to an embodiment of the invention.
Figure 22B:
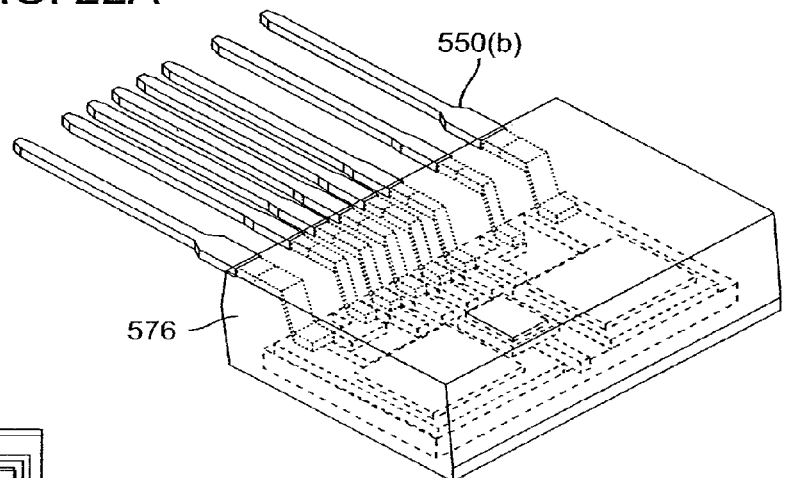
Figure 22C:
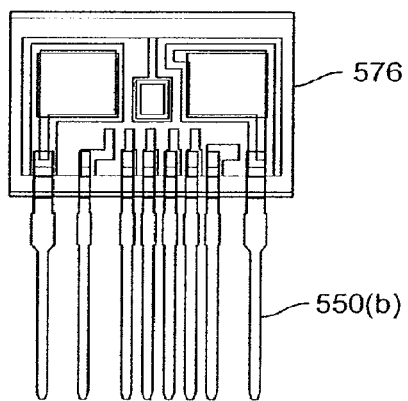
Figure 22D:
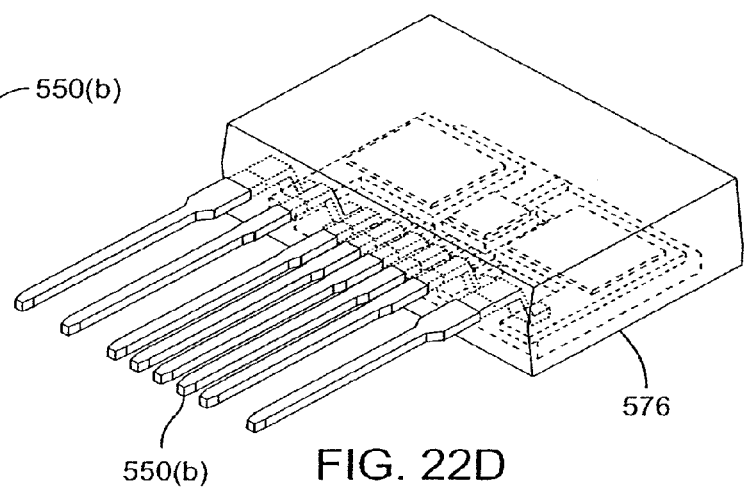

After the semiconductor die assembly 560 is formed, an encapsulating material 576 may be formed over the semiconductor dice 554. FIG. 22A shows a side, cross-sectional view of the semiconductor die package 577. In this example, the semiconductor die package 577 is a single in line package (SIP). FIGS. 22B, 22C, and 22D show top perspective, top plan, and top perspective views of the semiconductor die package 577. The resulting package can be a high thermal efficiency package and can be sued in an LCD TV module package.

It is understood that the above-described technique could be used to form a dual in-line package (DIP) as well. To form a dual in line package, the previously described frame structure 550 would have two sets of leads facing inward towards the central region 550(c). Both sets of leads would then be attached to the substrate (with or without semiconductor dice mounted thereon), and then the resulting assembly would be encapsulated as described above to form a DIP type semiconductor die package.

The above-described embodiments have a number of advantages over conventional structures. For example, compared to direct bonded copper (DBC) substrates, embodiments of the invention are less expensive, because DBC substrates require the use of expensive base materials and high processing temperatures. Also, in a DBC substrate, the thermal mismatch between copper and ceramic in the DBC can induce high interface stress and can induce package reliability issues. In addition, the high processing temperatures needed to form DBC substrates can create higher panel warpage.

Thermal clad boards are another type of substrate. They use a combination of aluminum (1-1.5 mm), dielectric (50-80 microns), copper (35-400 microns), and electroless nickel (3-5 microns).

Embodiments of the invention have a number of advantages over thermal clad boards. For example, compared to thermal clad boards, embodiments of the invention require fewer layers and are therefore less costly to manufacture. In addition, thermal clad boards have a higher thermal resistance than embodiments of the invention and can have more CTE mismatch issues. Thermal mismatch can generate high interfacial stress and can induce package reliability issues.

Lastly, as shown above, embodiments of the invention can be constructed with a common leadframe structure for flexible module assembly.

VI. System in a Package Including a Voltage Regulator

Many of the above described embodiments relate to the formation and use of premolded substrates in semiconductor die packages. The foregoing semiconductor die package embodiments are directed to specific configurations for power semiconductor die packages. The semiconductor die packages may be used with power supplies and/or voltage regulators. The embodiments that are described below may use any of the premolded substrates described above, or any other suitable substrate that can support one or more semiconductor dice.

As the demand for broadband applications increases, the design requirements of microprocessors become more complex. This has caused CPU clock frequencies to rise and this has resulted in an increase in power consumption. In general, voltage regulators are designed with the following requirements in mind: (1) the voltage regulator has a high response, operates at a reduced voltage, and accommodates high current levels (e.g., from a 1.3V and 70 A output to a 0.8V and 150 A output); and (2) the voltage regulator has increased efficiency at higher switching frequencies to keep any potential losses at low levels.

To create a voltage regulator combining high frequency and high-efficiency operation, it is desirable to improve each of the individual devices incorporated into the power MOSFETs and also to reduce the parasitic inductance of the wiring between the devices. By integrating a driver IC and high and the low-side power MOSFETs into a single package, a substantial increase in efficiency can be achieved with significant miniaturization.

Conventional packages for synchronous buck converters or the like typically have three die paddles, one for each of a driver IC, a high side MOSFET die, and a low side MOSFET die. In the conventional package, the high side MOSFET source is connected to a low side MOSFET drain with bond wires. This creates high parasitic inductance. In addition, in conventional packages, the connection of the driver IC to the high side and low side MOSFET gate, source and drain is also performed using bond wires. Using individual paddles requires the use of longer bond wires. Such factors reduce the high-frequency power efficiency and thermal performance of conventional packages. In general, multi-die paddle packages have a lower package reliability level than embodiments of the invention.

Figure 23:
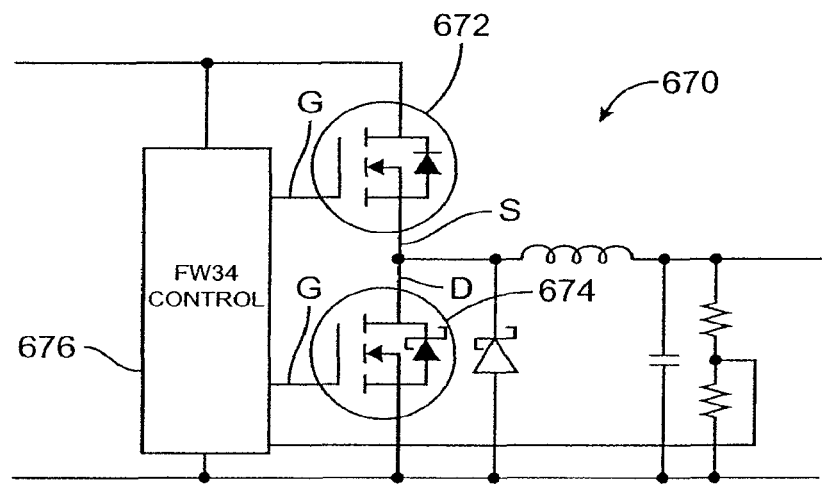
FIG. 23 is a circuit diagram for a synchronous buck converter that corresponds to the package shown in FIG. 24C.

A synchronous buck converter can use a driver IC, a high-side power MOSFET and a low-side power MOSFET. FIG. 23 shows a simplified schematic diagram of a typical synchronous buck converter. Synchronous buck converter (SBC) 670 includes a high-side metal oxide semiconductor field effect transistor (MOSFET) 672 and a low-side MOSFET 674. The drain D of the low-side MOSFET 674 is electrically connected to the source S of the high-side MOSFET 672.

Most commercially produced MOSFETs are vertical devices, and are packaged such that the external points of connection to the gate, drain, and source are on the same geographic plane of the device.

The connection between the source S and the drain D of the high and low-side MOSFETs 672 and 674, respectively, in SBC 670, desirably have very low inductance in order for the SBC 670 to be used at moderate to high operating/switching frequencies. Where MOSFETs 672 and 674 are configured as discrete devices, the design of the circuit layout of SBC 670 is desirably optimized to reduce parasitic inductances. Alternatively, SBC 670 can be configured as a fully-integrated synchronous buck converter in a single converter in a single package and which is designed and laid out to reduce parasitic inductances in the connection between the source S and the drain D of the high and low-side MOSFETs 672 and 674, respectively. Such fully integrated devices, however, tend to be fairly application and/or design specific devices that are often not compatible with other applications and/or designs. Further, the printed circuit board traces/conductors that connect the MOSFETs are typically not well-suited to carrying moderate to high levels of current.

In embodiments of the invention, a new dual common paddle package (e.g., a 9×5 mm-26-pin dual side flat, no-lead package) can overcome problems with conventional packages. Embodiments of the invention can have the following characteristics:

- A driver IC, a high side MOSFET, and a low side MOSFET may share the same paddle.
- The high side MOSFET may be flip chip attached to the die paddle, while the low side MOSFET can use conventional a conventional soft solder die attach material.
- The source of the high side MOSFET is thus automatically connected to the drain of the low side MOSFET though the die attach paddle.
- The drain of the high side MOSFET can be connected to external pins with one or more metal strip clip bonds or one or more wire bonds.
- The driver IC can also be seated between the high and low side MOSFET to reduce wire lengths.
- The driver IC uses a non-conductive die attach material to isolate it from the MOSFETs.
- The packages according to embodiments of the invention have a smaller footprint (e.g., 70%) and a smaller pin count (e.g., 26) as compared to conventional packages such as 8×8 QFN packages.

One exemplary method according to an embodiment of the invention includes obtaining a substrate comprising a conductive die attach surface, and attaching a high side transistor including a high side transistor input to the substrate. The high side transistor input is coupled to the conductive die attach surface. A low side transistor including a low side transistor output is also attached to the substrate. The low side transistor input is coupled to the conductive die attach surface.

Figure 24A:
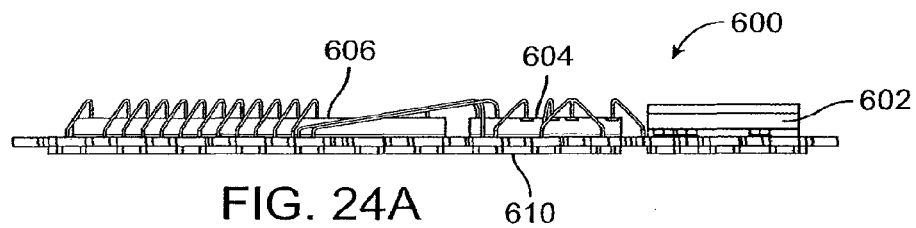
FIG. 24A shows a side view of a semiconductor die package according to an embodiment of the invention.

FIG. 24A shows a side, cross-sectional view of a semiconductor die package 600 according to an embodiment of the invention. The semiconductor die package 600 has a low side transistor 606, a high side transistor 602, and a control die 604 mounted on a substrate 610.

Figure 24B:
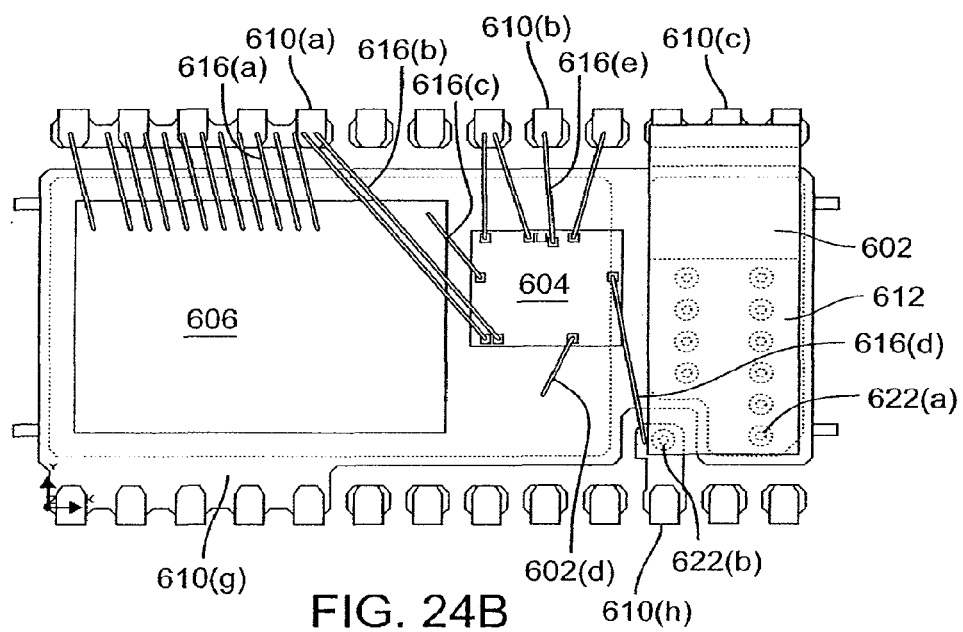
FIG. 24B shows a top plan view of a semiconductor die package according to an embodiment of the invention.
Figure 24C:
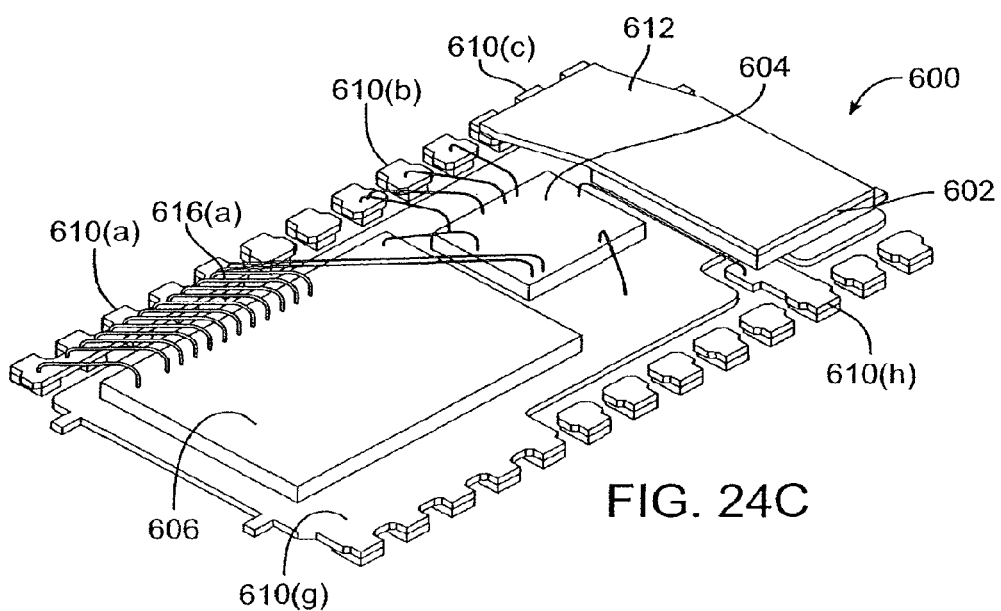
FIG. 24C shows a perspective view of a semiconductor die package according to an embodiment of the invention.

FIG. 24B shows a top plan view of the semiconductor die package 600 shown in FIG. 24A. FIG. 24C shows a perspective view of the semiconductor die package 600 shown in FIG. 24A. Referring to both FIGS. 24B and 24C, the semiconductor die package 600 has a low side transistor die 606, a high side transistor die 602, and a control die 604 mounted on a substrate 610. The high side transistor in the high side transistor die 602 and the low side transistor in the low side transistor die 606 can be power transistors such as vertical power MOSFETs. Vertical power MOSFET dice are described in further detail above.

In this example, the substrate 610 includes high side source leads 610(*c*), a high side gate lead 610(*h*), a conductive die attach surface 610(*g*), low side source leads 610(*a*), and control leads 610(*b*). The substrate 610 may be a pre-molded substrate, as described above, may be a single, conductive leadframe structures, or may be some other suitable structure. The conductive die attach surface 610(*g*) may occupy the part of the surface of the substrate 610 or the entire upper surface of the substrate 610.

There can be a number of connections to the high side MOSFET die 602. For example, a drain clip 612 is attached to the drain region in the high side MOSFET die 602. A number of solder structures 622(*a*) may be used to electrically and mechanically couple the drain region in the high side MOSFET die 602 to the drain clip 612. One or more drain wires may be used instead of, or in addition to the drain clip 612 in this example.

As shown in FIG. 24B, the gate region in the high side MOSFET die 602 is coupled to a gate lead 610(*h*). A solder structure 622(*b*) may couple the gate lead 610(*h*) to the gate region in the high side MOSFET die 602. The source region in the high side MOSFET die 602 is coupled to the conductive die attach surface 610(*g*). Solder (not shown) may also be used to electrically couple the source region in the high side MOSFET die 602 to the conductive die attach surface 610(*g*).

There can also be a number of connections to the low side MOSFET die 606. For example, source wires 616(*a*) can couple the source region in the low side MOSFET die 606 to the source leads 610(*a*) of the substrate 610. As an alternative, one or more source clips could be used in place of or in addition to the source wires 616(*a*). The source wires 616(*a*) may comprise copper, gold, or any other suitable material. The gate region of the low side MOSFET die 606 is coupled to the control chip 604 using a wire 616(*c*).

The drain region of the low side MOSFET die 606 is coupled to the conductive die attach surface 610(*g*) of the substrate 610, though a conductive die attach material such as solder or the like. Lead-based, or non-lead based solder can be used to attach the drain region of the low side MOSFET die 606 to the die attach surface 610(*g*).

The control chip 604 is also mounted on the conductive die attach surface 610(*g*) of the substrate 610, but may be electrically isolated from the substrate 610. A number of bonding wires 616(*e*) may couple terminals in the control chip 604 to control leads 610(*b*). A wire 602(*d*) may also couple a terminal in the control chip 604 to the conductive die attach surface 610(*g*). In some cases, conductive clips could be used instead of bond wires.

Figure 24D:
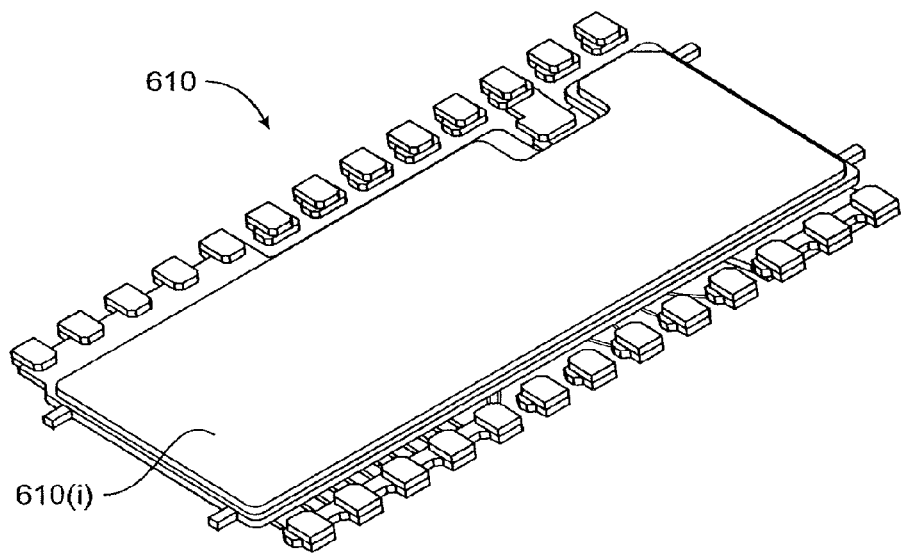
FIG. 24D is a bottom perspective view of a leadframe structure.

FIG. 24D shows a bottom view of the substrate 610. As shown in FIG. 24D, the bottom of the substrate 610 may have a half-etched portion 610(*i*).

Figure 24E:
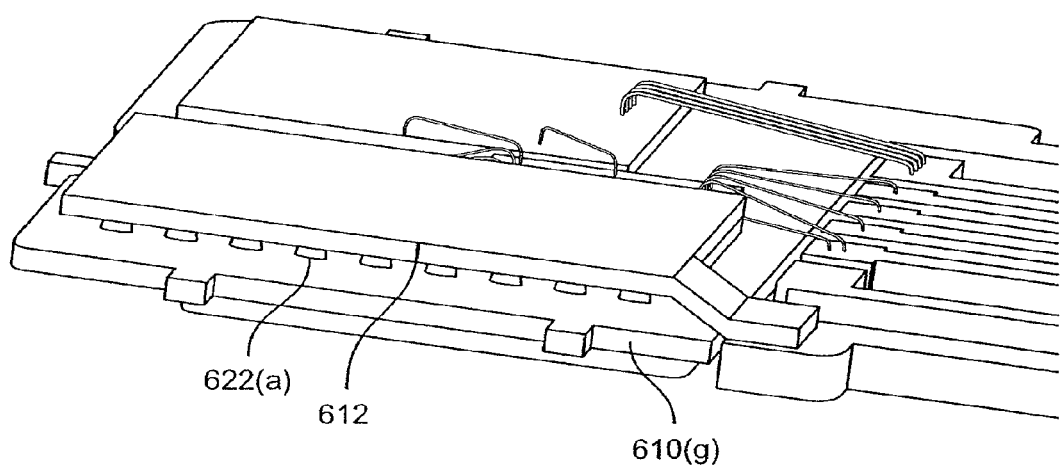
FIG. 24E is side perspective view of a semiconductor die package according to an embodiment of the invention.

FIG. 24E shows a perspective view of the semiconductor die package 600.

Figure 25:
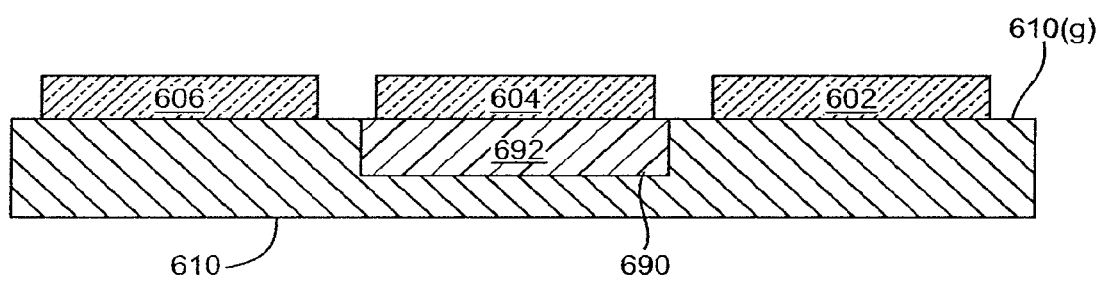
FIG. 25 shows a side view of another embodiment of the invention. In this embodiment, a molding material is deposited within a leadframe and isolates a chip from conductive regions of the leadframe structure.

FIG. 25 shows a side, cross-sectional view of a substrate 610 according to another embodiment of the invention. The substrate 610 includes a recess 690 that is filled with a molding material 692. A control chip 604 is on top of the molding material 692. The molding material 692 electrically isolates the control chip 604 from the conductive portions of the substrate 610. As in prior embodiments, a low side MOSFET die 606 and a high side MOSFET die 602 are on the substrate 610.

The recess 690 may be formed by etching, milling or the like. The molding material 692 may be deposited in the recess and then subsequently cured or solidified.

The embodiment shown in FIG. 25 has a number of advantages. For example, the molding material 692 electrically isolates the control chip 604 from the high and low side dice 602, 606, without increasing the height of the formed semiconductor die package.

The embodiments that are described above have a number of advantages. Such advantages include a smaller footprint, and better thermal and electrical performance. Such embodiments can be used in a variety of package configurations including single in line packages, and dual in line packages.

Any of the above-described embodiments and/or any features thereof may be combined with any other embodiment(s) and/or feature(s) without departing from the scope of the invention. For example, although system in a package type modules are not specifically described with respect to the embodiments shown in FIGS. 1-2, it is understood that such embodiments may be used for system in a package type modules without departing from the spirit and scope of the invention.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Any reference to positions such as "top", "bottom", "upper", "lower", etc. refer to the Figures and are used for ease of illustration and are not intended to be limiting. They are not intended to refer to absolute positions.

The semiconductor die packages described above may be used in any suitable electrical apparatus. For example, they may be used in personal computers, server computers, cell phones, appliances, etc.

A recitation of "a", "an" or "the" is intended to mean "one or more" unless specifically indicated to the contrary.

All patents, patent applications, publications, and descriptions mentioned above are herein incorporated by reference in their entirety for all purposes. None is admitted to be prior art.

What is claimed is:

1. A semiconductor die package comprising:
   a premolded substrate including a leadframe structure and a molding material, wherein the leadframe structure includes a first conductive portion, a second conductive portion, and an intermediate portion between the first conductive portion and the second conductive portion, and wherein the intermediate portion includes a cavity that electrically isolates the first conductive portion and the second conductive portion;
   a semiconductor die on the premolded substrate; and
   an encapsulating material covering the semiconductor die and filling the cavity between the first conductive portion and the second conductive portion.

2. The semiconductor die package of claim 1 wherein the semiconductor die comprises a power MOSFET.

3. The semiconductor die package of claim 1 wherein the semiconductor die comprises a vertical device.

4. The semiconductor die package of claim 1 wherein the semiconductor die has a first surface distal to the substrate and a second surface proximate to the substrate, wherein the package further includes wirebonds electrically coupling the first surface of the die to the substrate.

5. The semiconductor die package of claim 1 wherein the semiconductor die is directly over an insulated portion of the substrate.

6. The semiconductor die package of claim 1 wherein the semiconductor die package does not have leads extending laterally away from the encapsulating material.

7. The semiconductor die package of claim 1 wherein the cavity was formed by cutting the intermediate portion.

8. The semiconductor die package of claim 1 wherein the cavity was formed by cutting the intermediate portion using a saw, a laser, or a water jet.

9. The semiconductor die package of claim 1 wherein the attached semiconductor die overlaps with at least a portion of the first conductive portion.

10. The semiconductor die package of claim 1 wherein the leadframe structure further comprises a conductive central portion inside of a region defined by a plurality of first conductive portions.

* * * * *